(12) United States Patent
Piñol Pedret et al.

(10) Patent No.: US 11,081,820 B2
(45) Date of Patent: Aug. 3, 2021

(54) ADJUSTABLE CIRCUIT BOARD ASSEMBLY

(71) Applicant: LEAR CORPORATION, Southfield, MI (US)

(72) Inventors: Montserrat Piñol Pedret, Valls (ES); Ferran Juanes Ribas, Valls (ES); Primitivo Aznar, Valls (ES); Enric Aparicio Rollan, Valls (ES)

(73) Assignee: Lear Corporation, Southfield, MI (US)

( * ) Notice: Subject to any disclaimer, the term of this patent is extended or adjusted under 35 U.S.C. 154(b) by 630 days.

(21) Appl. No.: 15/619,605

(22) Filed: Jun. 12, 2017

(65) Prior Publication Data

US 2018/0138611 A1   May 17, 2018

Related U.S. Application Data

(60) Provisional application No. 62/422,309, filed on Nov. 15, 2016.

(51) Int. Cl.
| | | |
|---|---|---|
| *H01R 12/70* | (2011.01) | |
| *H01R 12/71* | (2011.01) | |
| *H01R 43/02* | (2006.01) | |
| *H05K 1/11* | (2006.01) | |
| *H01R 12/51* | (2011.01) | |
| *H01R 24/66* | (2011.01) | |
| *H05K 1/02* | (2006.01) | |
| *H05K 3/34* | (2006.01) | |

(52) U.S. Cl.
CPC ......... *H01R 12/7052* (2013.01); *H01R 12/51* (2013.01); *H01R 12/707* (2013.01); *H01R 12/7082* (2013.01); *H01R 12/716* (2013.01); *H01R 24/66* (2013.01); *H01R 43/0256* (2013.01); *H01R 43/0263* (2013.01); *H05K 1/0289* (2013.01); *H05K 1/111* (2013.01); *H05K 3/341* (2013.01); *H01R 12/7064* (2013.01); *H01R 12/718* (2013.01); *H05K 2201/10621* (2013.01)

(58) Field of Classification Search
CPC .............. H01R 12/707; H01R 12/7052; H01R 12/7011–707; H01R 12/718; H01R 12/58; H01R 12/716; H01R 12/7082; H01R 43/0256; H01R 43/0263
See application file for complete search history.

(56) References Cited

U.S. PATENT DOCUMENTS 3,917,984 A    11/1975  Kong et al.
4,129,351 A *  12/1978  Sugimoto ............ H01R 23/725
                                                        439/325

(Continued)

*Primary Examiner* — Livius R. Cazan
(74) *Attorney, Agent, or Firm* — Fishman Stewart PLLC

(57) ABSTRACT

The present disclosure includes an adjustable circuit board assembly including a circuit board, a header connected to the circuit board, and a matrix connector. The header may be configured for connection with the circuit board via a connection matrix and the matrix connector. A method of manufacturing a circuit board assembly may include providing a circuit board, providing a terminal header having a plurality of terminals, providing a connection matrix to at least one of the circuit board and the terminal header, providing a matrix connector, connecting the terminal header with the circuit board via the matrix connector and the connection matrix, and connecting the plurality of terminals to the circuit board.

18 Claims, 22 Drawing Sheets

(56) References Cited

U.S. PATENT DOCUMENTS

| | | | |
|---|---|---|---|
| 5,413,491 A * | 5/1995 | Noschese | H01R 23/688 439/108 |
| 5,439,162 A | 8/1995 | George et al. | |
| 5,934,936 A | 8/1999 | Chiu et al. | |
| 6,135,823 A * | 10/2000 | Torii | H01R 12/716 439/58 |
| 8,611,100 B2 | 12/2013 | Kuo et al. | |
| 2002/0111064 A1* | 8/2002 | Kohno | H01R 12/716 439/547 |
| 2006/0102700 A1 | 5/2006 | Huang et al. | |
| 2008/0311767 A1* | 12/2008 | Weber | H01R 12/57 439/62 |

\* cited by examiner

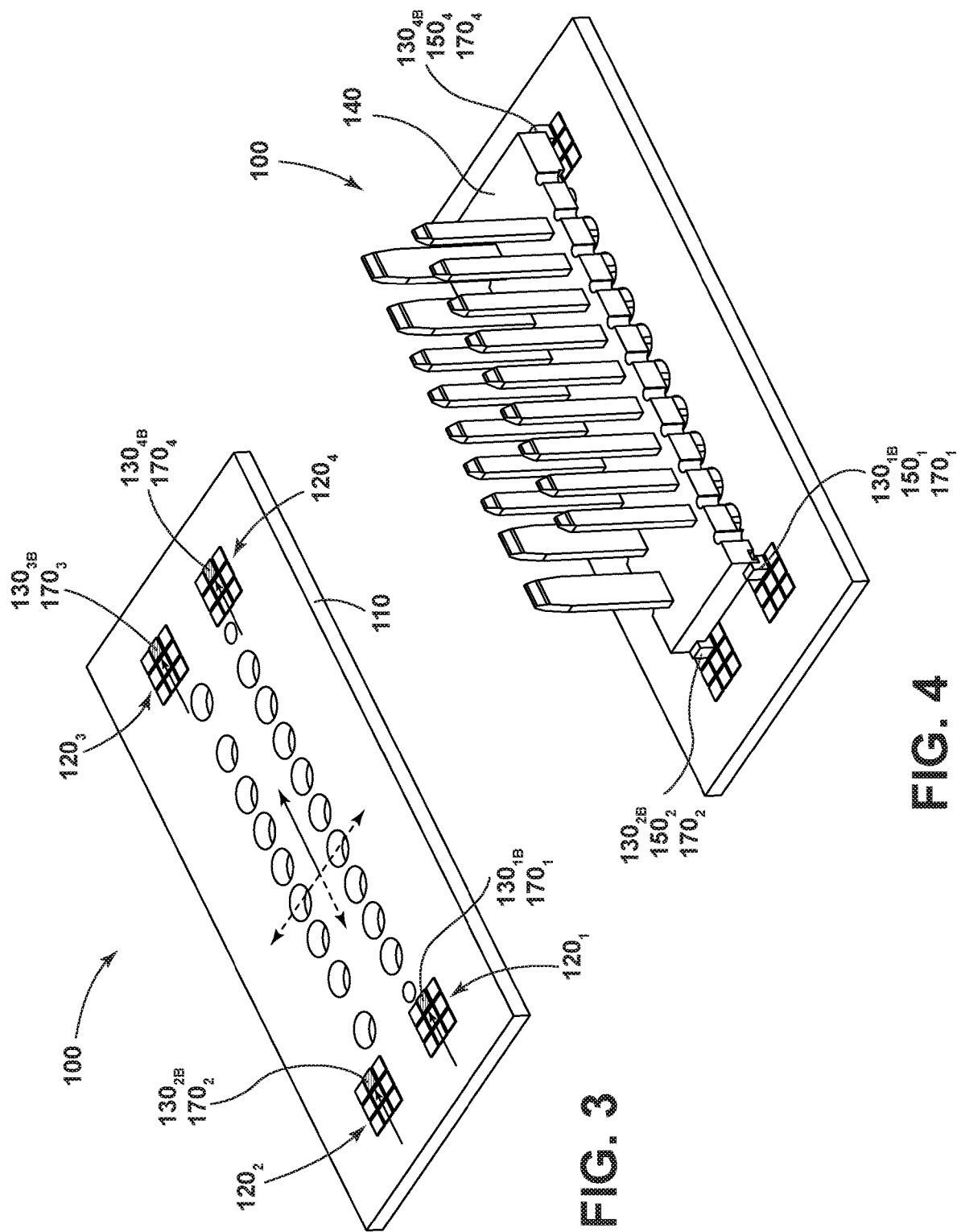

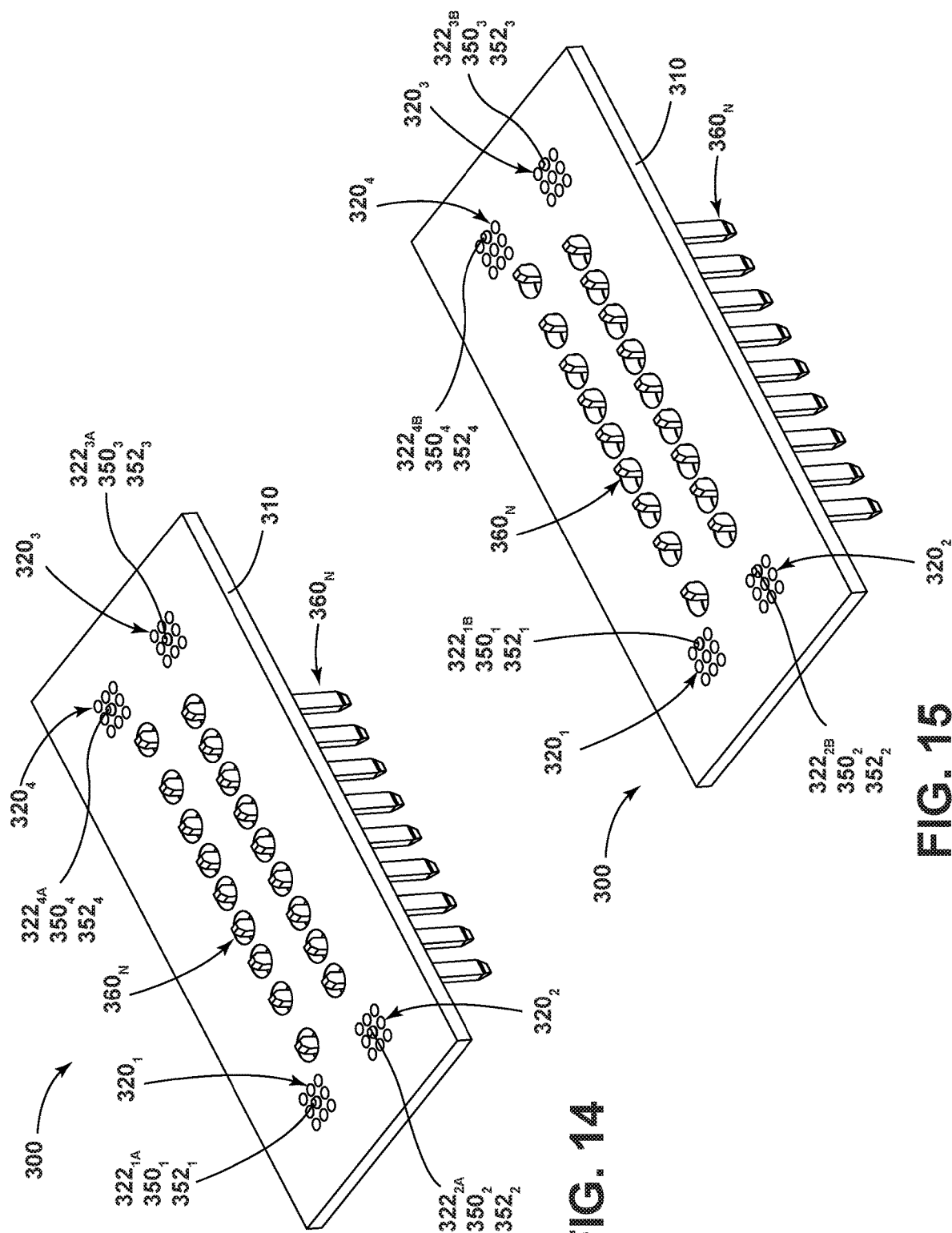

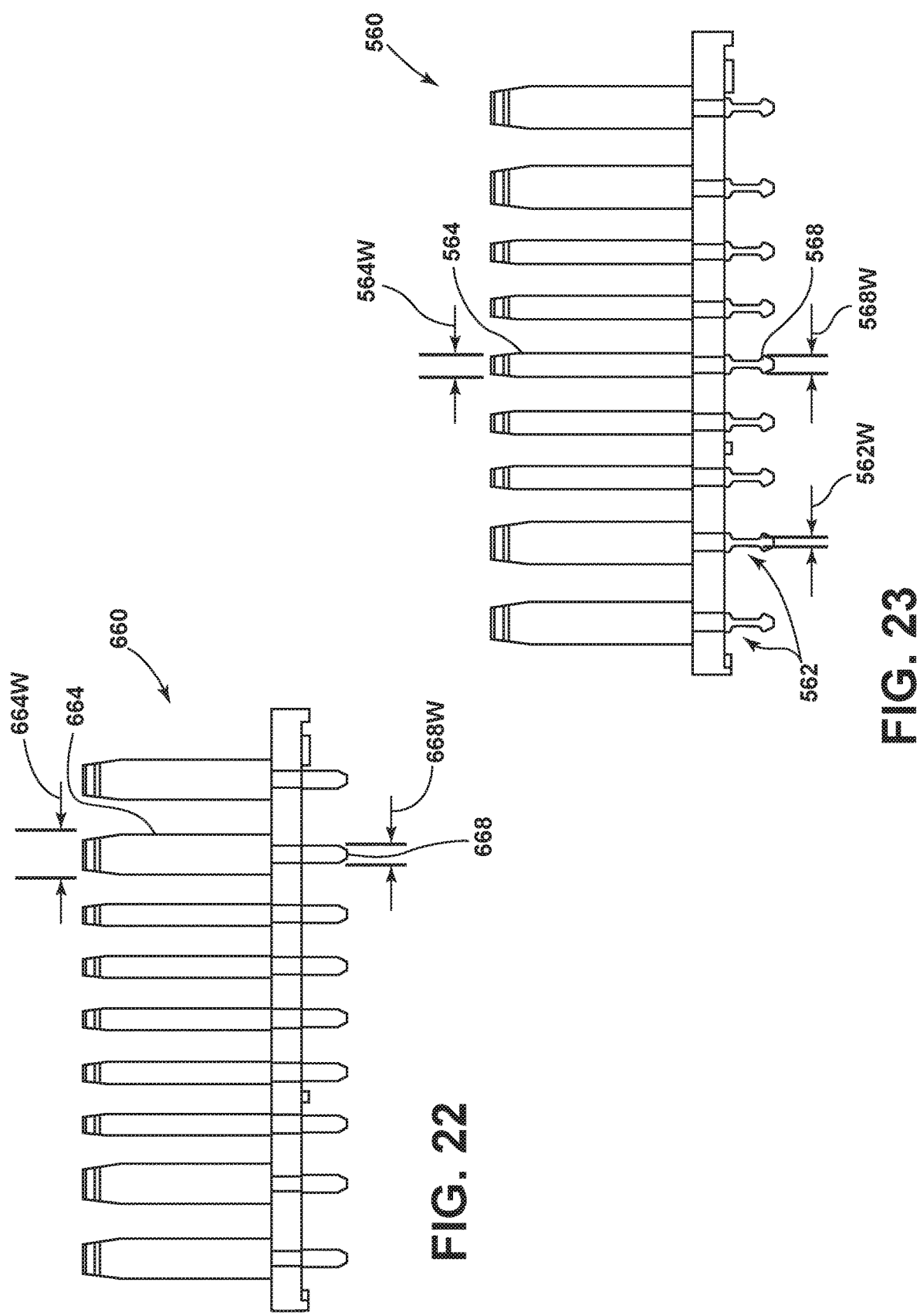

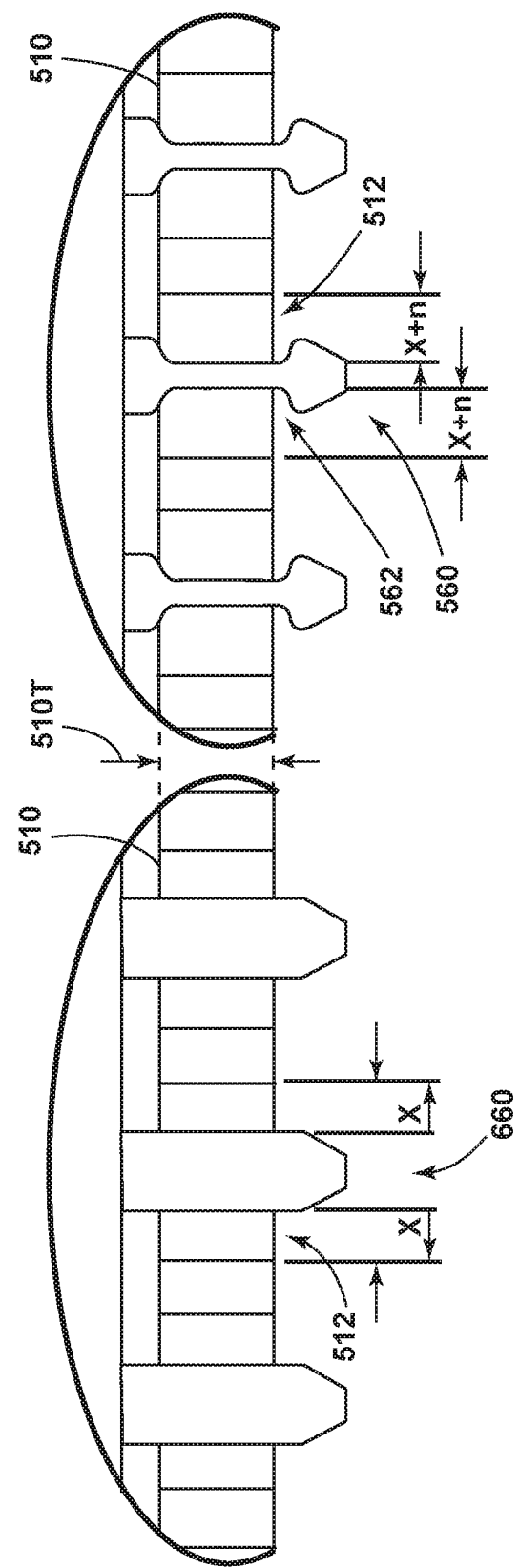

ADJUSTABLE CIRCUIT BOARD ASSEMBLY

CROSS-REFERENCE TO RELATED APPLICATION

This application claims the benefit of U.S. Provisional Patent Application Ser. No. 62/422,309, filed on Nov. 15, 2016, the disclosure of which is hereby incorporated herein by reference in its entirety.

TECHNICAL FIELD

The present disclosure relates to circuit board assemblies, including printed circuit boards and electrical pin/terminal headers.

BACKGROUND

This background description is set forth below for the purpose of providing context only. Therefore, any aspects of this background description, to the extent that it does not otherwise qualify as prior art, is neither expressly nor impliedly admitted as prior art against the instant disclosure.

In some circumstances an initial circuit board assembly may be designed for a particular application. Later, it may be determined that a change should be made to certain dimensions of the design, but such changes may involve new manufacturing components (e.g., molds), additional design review (e.g., validation), and/or other additional time and/or resources.

There is therefore a desire for solutions/options that minimize or eliminate one or more of the above-described shortcomings. The foregoing discussion is intended only to illustrate the present field and should not be taken as a disavowal of scope.

SUMMARY

In embodiments, an adjustable circuit board assembly may include a circuit board, a header connected to the circuit board, and/or a matrix connector. The header may be configured for connection with the circuit board via a connection matrix and the matrix connector. The circuit board may include the connection matrix. The connection matrix may include a plurality of solder pads. The plurality of solder pads may include at least three solder pads. An adjustable circuit board assembly may include at least one additional connection matrix (e.g., at least two total connection matrices) and at least one additional matrix connector (e.g., at least two total matrix connectors). The header may be connected to the circuit board via a second connection matrix a second matrix connector, via a third connection matrix and a third matrix connector, and/or via a fourth connection matrix and a fourth matrix connector. The matrix connector may include a substantially rectangular box shape and a material compatible with soldering. The matrix connector may include a protrusion disposed in a recess or aperture of the circuit board. The connection matrix may include a plurality of recesses or apertures configured to receive a protrusion of the matrix connector.

With embodiments, the circuit board may include the connection matrix and at least one other connection matrix (e.g., the circuit board may include at least two connection matrices). The connection matrix and the at least one other connection matrix may each include a plurality of solder pads. The header may include a first connected position relative to the circuit board in which the matrix connector is connected with a first area of the connection matrix (e.g., a solder pad, an aperture, etc.). The header may include a second connected position relative to the circuit board in which the matrix connector is connected with a different, second area of the connection matrix (e.g., a different solder pad, a different aperture, etc.). In a first connected position, a terminal connected with the header may be disposed in a first terminal position in an aperture of the circuit board. In a second connected position, the terminal may be disposed in a different second terminal position in the aperture of the circuit board. The header may include the connection matrix. The matrix connector may be formed in the terminal header.

In embodiments, an adjustable circuit board assembly may include a plurality of terminals connected to the header. At least one terminal of the plurality of terminals may include a thin portion disposed in an aperture of the circuit board. The thin portion may be disposed between an upper portion and a lower portion of the at least one terminal. The upper portion and/or the lower portion may be wider than the thin portion. The thin portion may be at least 25% thinner than the upper portion and/or the lower portion.

With embodiments, a method of manufacturing a circuit board assembly may include providing a circuit board, providing a terminal header including a plurality of terminals, providing a connection matrix to at least one of the circuit board and the terminal header, providing a matrix connector, connecting the terminal header with the circuit board via the matrix connector and the connection matrix, and/or connecting the plurality of terminals to the circuit board. Connecting the terminal header with the circuit board may include soldering the matrix connector to the connection matrix at a first temperature. Connecting the plurality of terminals to the circuit board may include soldering the plurality of terminals to the circuit board at a second temperature. The second temperature may be lower than the first temperature.

In embodiments, a method of manufacturing a circuit board assembly may include providing a first circuit board and a second circuit board, which may be substantially identical, providing a first terminal header including a first plurality of terminals, providing a second terminal header including a second plurality of terminals, providing a first connection matrix to at least one of the first circuit board and the first terminal header, providing a second connection matrix to at least one of the second circuit board and the second terminal header, providing a first matrix connector, providing a second matrix connector, and/or connecting the first terminal header with the first circuit board via the first matrix connector to a first area of the first connection matrix, connecting the first plurality of terminals to the first circuit board to form a first circuit board assembly. The method may include connecting the second terminal header with the second circuit board via the second matrix connector to a second area of the second connection matrix. The second area of the second connection matrix may correspond to a different area than the first area. The method may include connecting the second plurality of terminals to the second circuit board to form a second circuit board assembly. A connected position of the second terminal header relative to the second circuit board may be different than a connected position of the first terminal header relative to the first circuit board.

The foregoing and other aspects, features, details, utilities, and advantages of the present disclosure will be apparent from reading the following description, and from reviewing the accompanying drawings.

BRIEF DESCRIPTION OF THE DRAWINGS

FIGS. 1-4 are perspective views of embodiments of circuit board assemblies according to teachings of the present disclosure.

FIGS. 14 and 15 are perspective views of bottoms of embodiments of circuit board assemblies according to teachings of the present disclosure.

FIGS. 22-24 are side views of embodiments of circuit board assemblies according to teachings of the present disclosure.

FIG. 26 is a cross sectional view of a circuit board assembly.

FIG. 27 is a cross sectional view of an embodiment of a circuit board assembly according to teachings of the present disclosure.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure.

Figure 1:
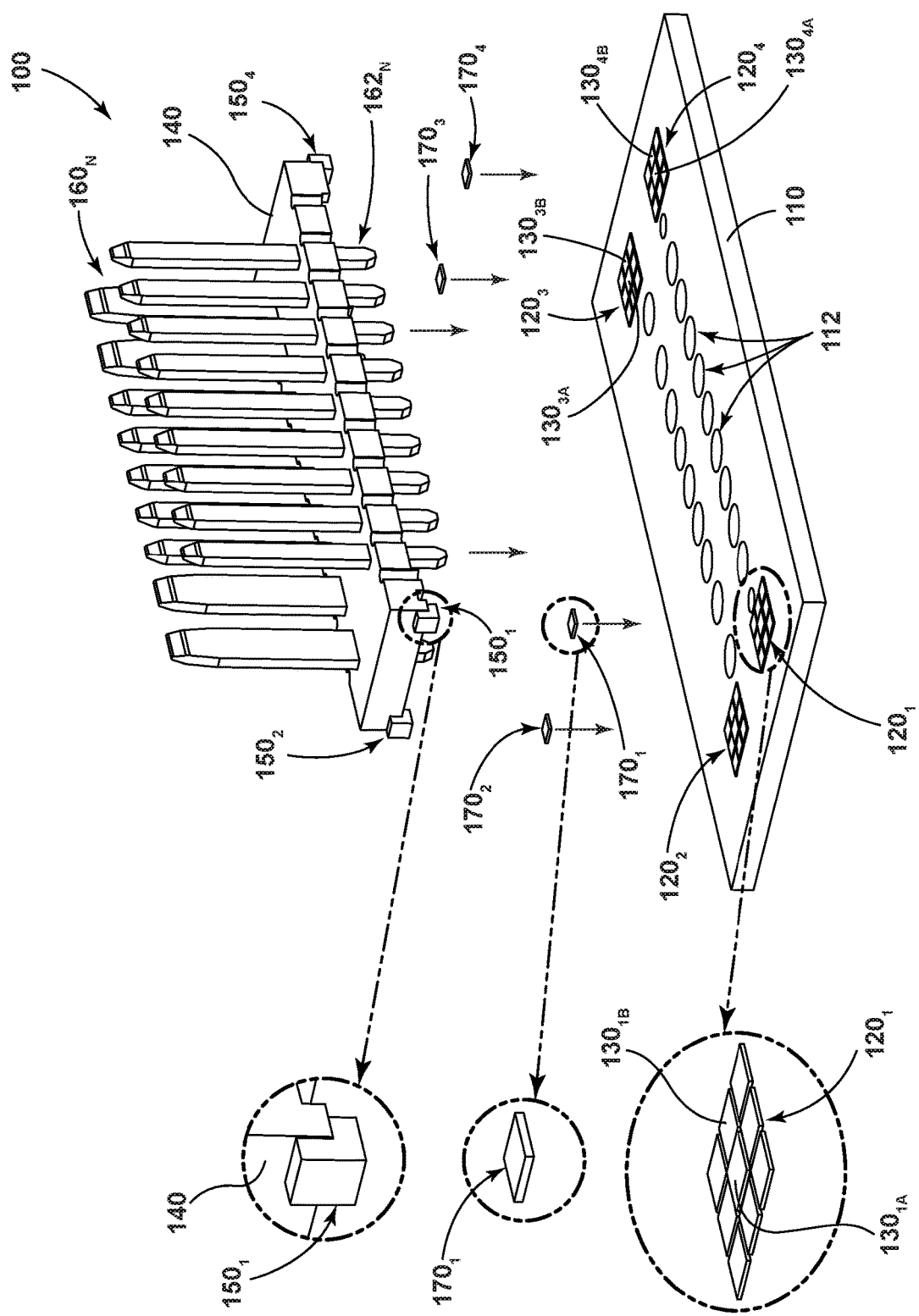
Figure 2:
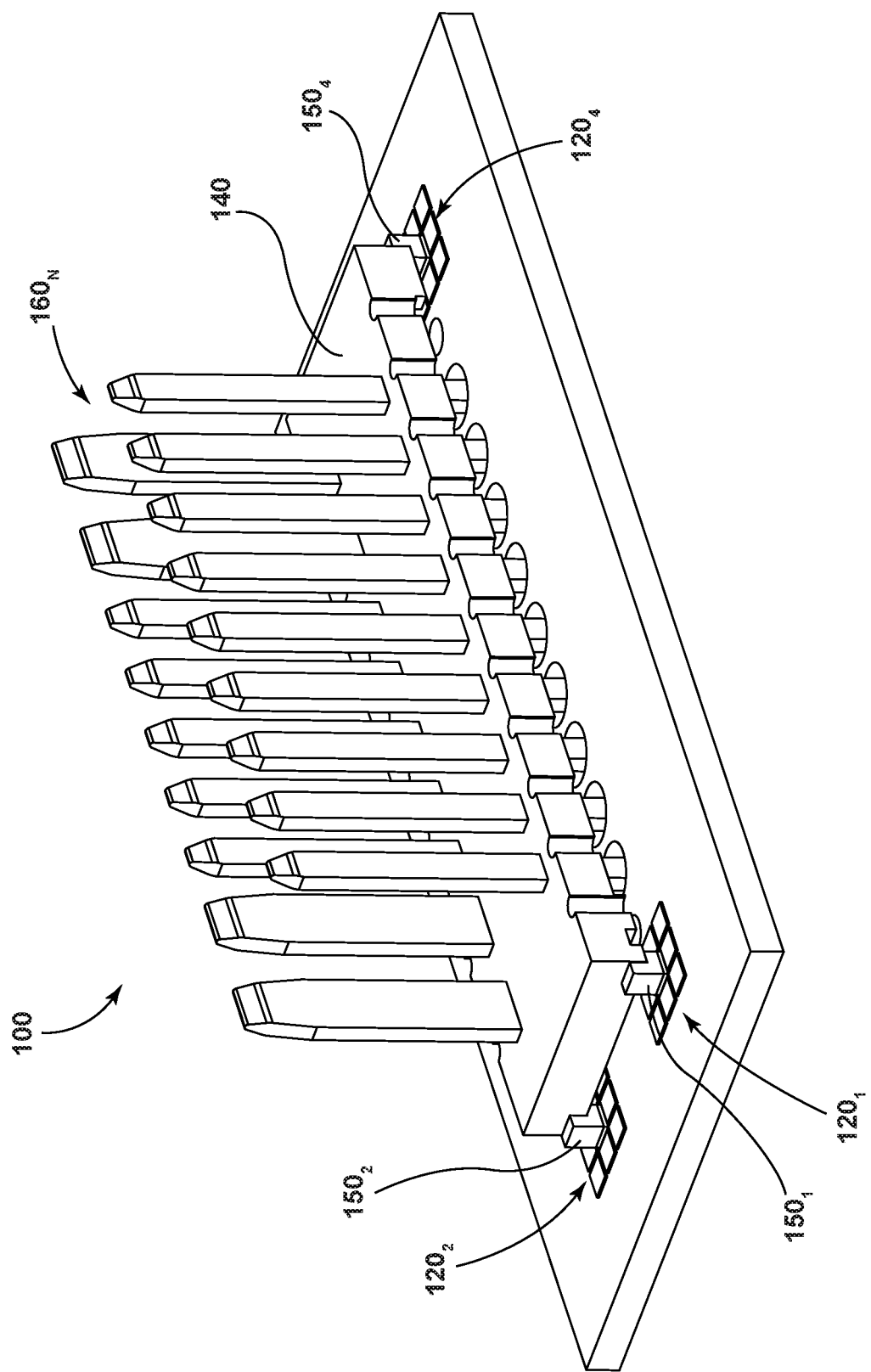

In embodiments, such as generally illustrated in FIGS. 1 and 2, an adjustable circuit board assembly 100 may include a circuit board 110 (e.g., a printed circuit board or PCB), a header 140, and/or one or more electrical terminals/pins $160_N$. Header 140 and/or terminals $160_N$ may be connected to circuit board 110 in one or more of a variety of ways. In some configurations, header 140 may be connected to and/or include terminals $160_N$, and terminals $160_N$ may be inserted into corresponding apertures 112 in circuit board 110 and connected to circuit board 110 via soldering the terminals $160_N$ to circuit board 110. In such configurations, terminals $160_N$ may generally be centered in the middle of apertures 112, and/or header 140 and terminals $160_N$ may be fixed relative to circuit board 110 once the solder cools/hardens. In some configurations, it may be desirable to adjust the positions of one or more of header 140, terminals $160_N$, and circuit board 110 relative to each other (e.g., in the event of a design change, for manufacturing tolerances, etc.). Terminals $160_N$ may be connected to circuit board 110 such that portions $162_N$ (e.g., ends) of terminals $160_N$ extend beyond circuit board 110.

In embodiments, circuit board 110 may include at least one connection matrix $120_N$ for connecting header 140 with circuit board 110. Connection matrix $120_N$ may include a plurality of solder pads $130_N$. For example, and without limitation, each connection matrix $120_N$ may include nine solder pads $130_N$ that may be disposed in a generally square-shaped configuration (e.g., in three columns each with three rows). Individual solder pads $130_N$ may, for example, be generally square-shaped. With embodiments, circuit board 110 may include four connection matrices $120_1$, $120_2$, $120_3$, $120_4$ and may be disposed such that each is generally aligned with a respective corner of header 140 in an assembled configuration.

With embodiments, circuit board assembly 100 may include at least one matrix connector $150_N$ which may be configured for connection with a connection matrix 120A, such as via a preform $170_N$, and/or with header 140. Circuit board assembly 100 may include a matrix connector $150_N$ for each respective connection matrix $120_N$ (e.g., four matrix connectors $150_1$, $150_2$, $150_3$, $150_4$, which may be disposed at or about corners of header 140 for connection with connection matrices $120_1$, $120_2$, $120_3$, $120_4$). Matrix connectors $150_N$ may include one or more of a variety of shapes, sizes, materials, and/or configurations. For example, and without limitation, matrix connectors $150_N$ may resemble a rectangular prism/block and may include a material compatible with soldering (e.g., a metal). Matrix connectors $150_N$ may be connected with header 140 in one or more of a variety of ways. For example, and without limitation, header 140 may be formed around matrix connectors $150_N$, matrix connectors $150_N$ may be press fit into header 140, matrix connectors $150_N$ may be snap fit with header 140, and/or matrix connectors $150_N$ may be connected/fastened to in another way (e.g., via a fastener).

Figure 5A:
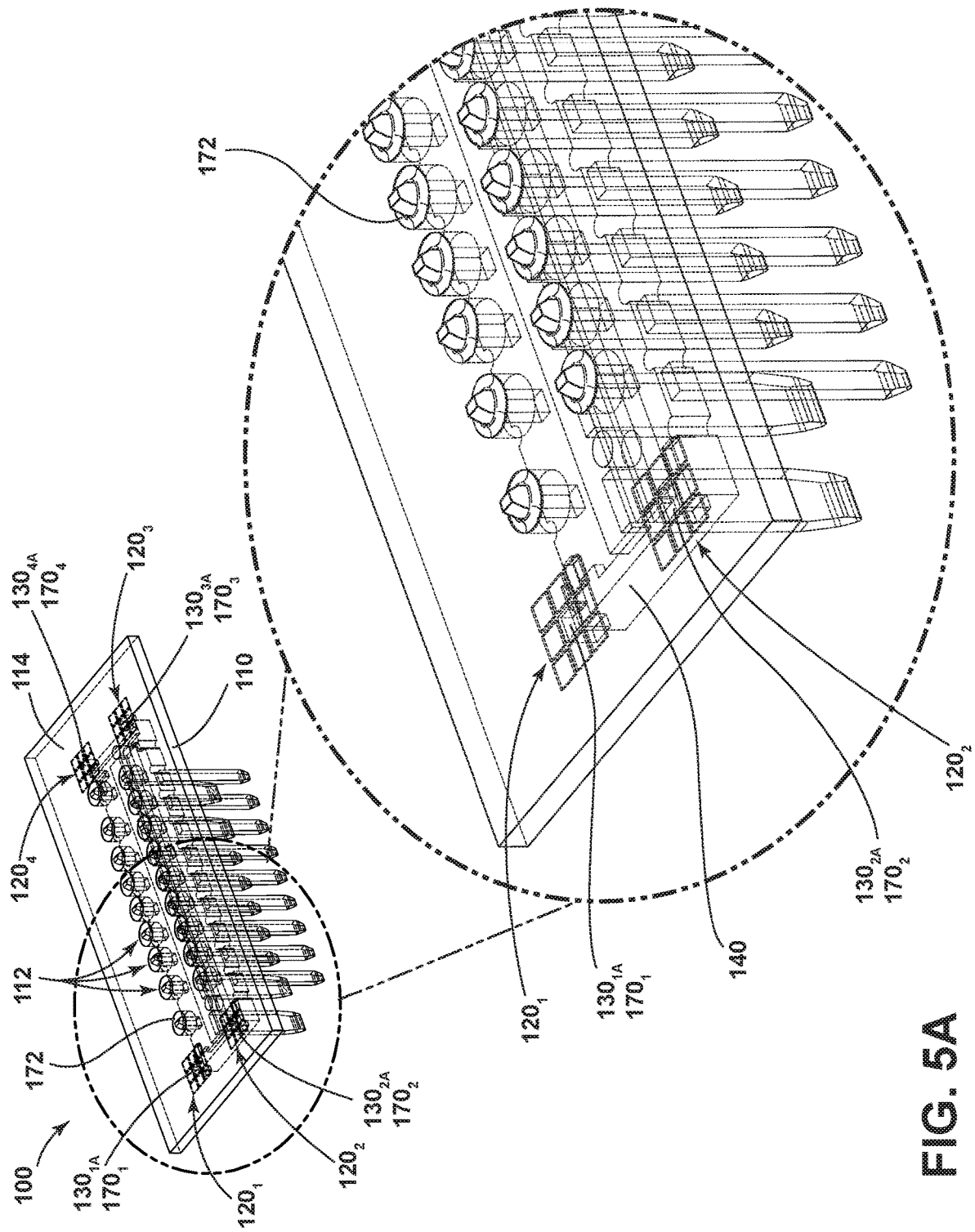
FIGS. 5A and 5B are perspective views, including respective enlarged views, of bottoms of embodiments of circuit board assemblies according to teachings of the present disclosure in which circuit boards are shown as transparent for illustrative purposes.
Figure 5B:
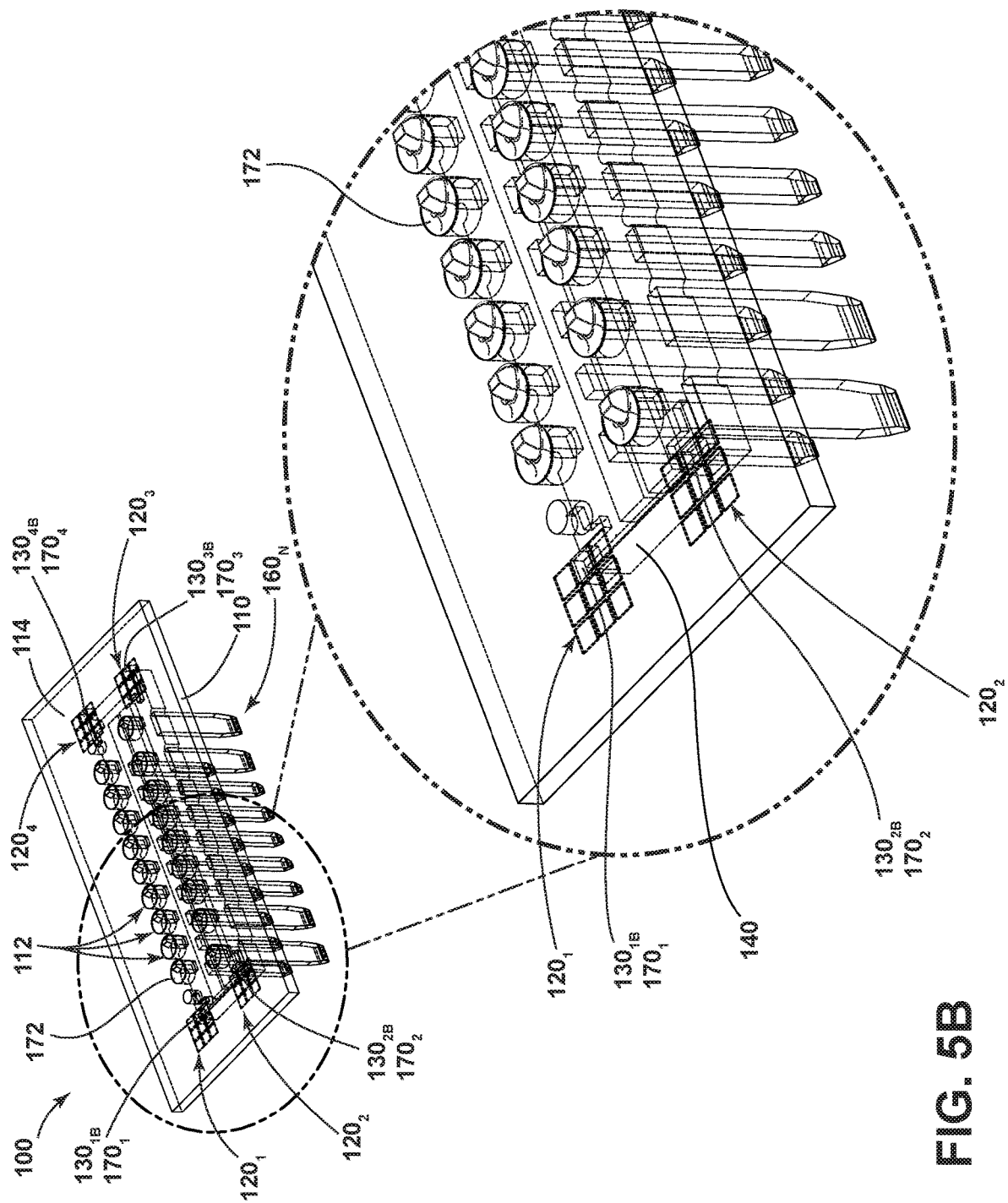
Figure 6:
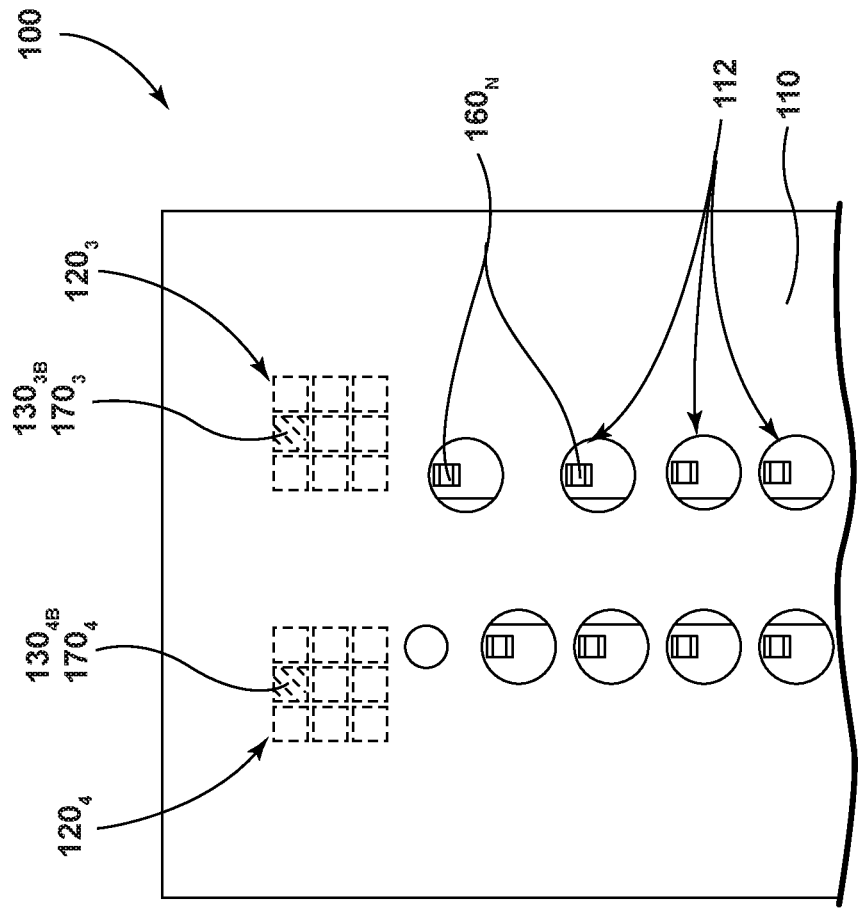
FIG. 6 is a bottom view of an embodiment of a circuit board assembly according to teachings of the present disclosure.

With embodiments, such as generally illustrated in FIGS. 2, 3, 4, 5A, 5B, and 6, circuit board assembly 100 may include a plurality of configurations. In a first configuration (see, e.g., FIGS. 3 and 5A), header 140 may be configured for connection with a first set of solder pads (e.g., solder pads $130_{1A}$, $130_{2A}$, $130_{3A}$, $130_{4A}$) of connection matrices $120_N$. For example, and without limitation, header 140 may be connected to circuit board 110 via connecting (e.g., soldering) matrix connectors $150_N$, which may be connected with header 140, to the first set of solder pads. In a second configuration (e.g., if a different position of header 140 and/or terminals $160_N$ relative to circuit board 110 is desired), header 140 may be connected to circuit board 110 via connecting matrix connectors $150_N$ to a different set of solder pads (e.g., solder pads $130_{1B}$, $130_{2B}$, $130_{3B}$, $130_{4B}$, such as generally illustrated in FIGS. 4 and 5B). For example, and without limitation, header 140 may be shifted in a forward direction, a rearward direction, a leftward direction, and/or a rightward direction (e.g., header 140 may be shifted in a single direction or multiple directions, such as forward and rightward, forward and leftward, rearward and rightward, or rearward and leftward). In embodiments, header 140 may include at least as many possible positions relative to circuit board 110 as solder pads $130_N$ in each connection matrix $120_N$ (e.g., nine).

In embodiments, apertures 112 of circuit board 110 may be sufficiently large (e.g., include sufficiently large diameters) to compensate for each potential configuration/position of header 140 and terminals $160_N$. For example, and without limitation, apertures 112 may be configured to receive terminals $160_N$ in each possible connection position of header 140 relative circuit board 110 (e.g., all nine positions).

Figure 7:
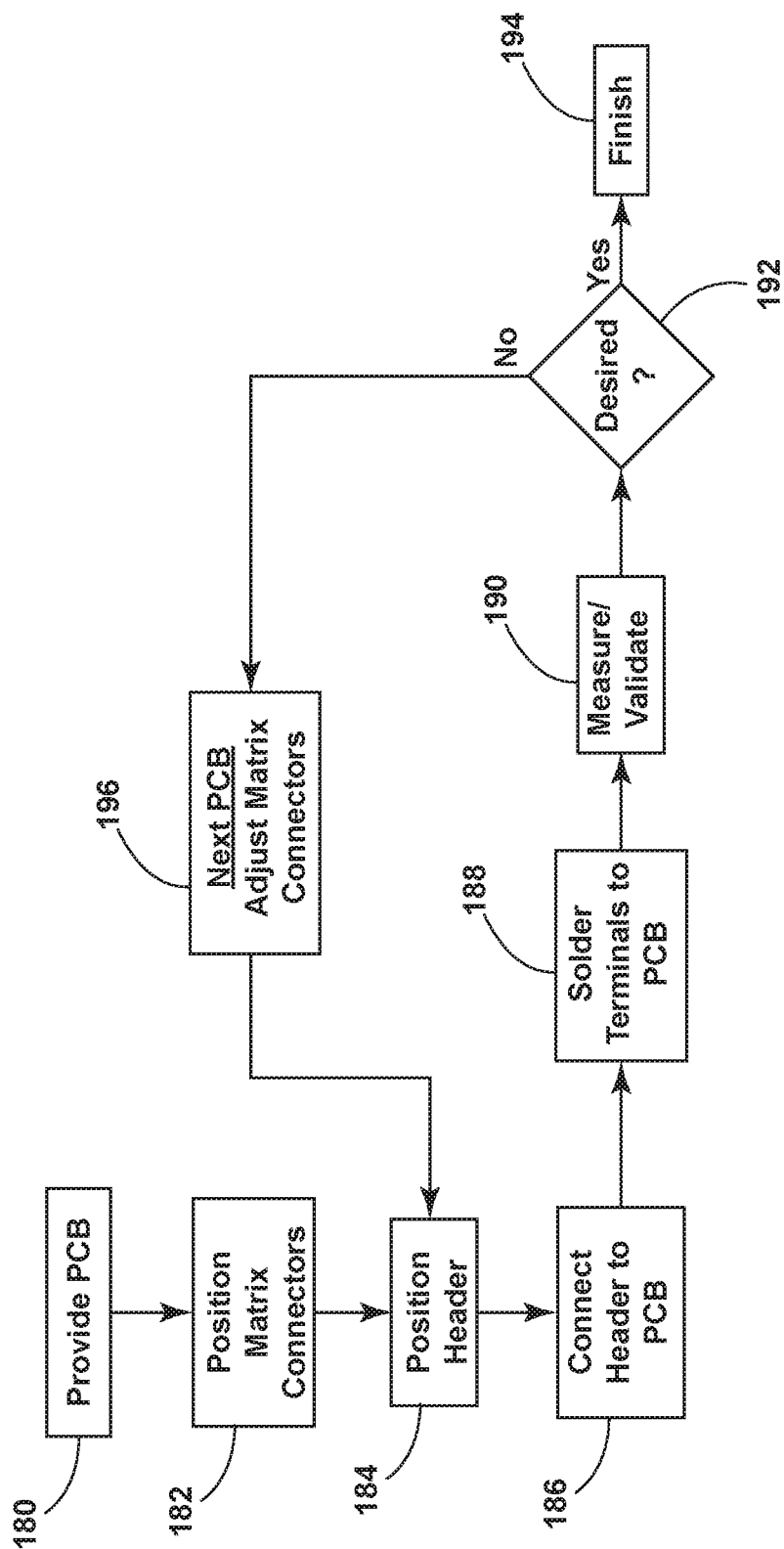
FIG. 7 is a flow diagram generally illustrating a method of assembling a circuit board assembly according to teachings of the present disclosure.

In embodiments, such as generally illustrated in FIG. 7, a method of assembling and/or adjusting circuit board assembly 100 may include, in step 180, providing circuit board 110 with one or more connection matrices $120_N$ and/or a plurality of apertures 112 that may be configured for receiving at least portions of electrical terminals $160_N$. In step 182, the method may include positioning matrix connectors $150_N$. In embodiments, positioning matrix connectors $150_N$ may include disposing a preform $170_N$ on certain positions of each of the one or more connection matrices $120_N$ (e.g., preforms $170_1$, $170_2$, $170_3$, $170_4$ on solder pads $130_N$). In embodiments, preforms $170_N$ may include solder and may be referred to herein as solder preforms $170_N$, but are not limited to solder preforms. For example, and without limitation, preforms $170_N$ may include adhesive, such as adhesive drops that may be used in connection with a curing process and/or drop dispensing tools. Additionally or alternatively, adhesive may be used for connecting one or more of circuit board 110, header 140, and matrix connectors $150_N$ together.

With embodiments, header 140 may be provided and/or connected with one or more matrix connectors $150_N$. In step 184, header 140 may be aligned with circuit board 110 such that the one or more matrix connectors $150_N$ are aligned with respective solder pads $130_N$ and/or connection matrices $120_N$. With embodiments, matrix connectors $150_N$ may be integrated with header 140. In such configurations, steps 182 and 184 may be combined (e.g., positioning matrix connectors $150_N$ may include simultaneously positioning header 140). In step 186, the method may include connecting header 140 with circuit board 110. Connecting header 140 with circuit board 110 may include inserting portions of terminals $160_N$ into respective apertures 112 of circuit board 110. Additionally or alternatively, connecting header 140 with circuit board 110 may include soldering the one or more matrix connectors $150_N$ with respective connection matrices $120_N$. Connecting header 140 with circuit board 110 may include positioning solder preforms $170_N$ at desired areas (e.g., solder pads $130_N$) of connection matrices $120_N$, heating solder preforms $170_N$ to their liquidus point/temperature, and/or allowing solder preforms $170_N$ to cool. If solder is not used and/or if a different connection material is used, an appropriate curing environment may be provided (e.g., light, temperature, time/duration, etc.), with embodiments.

In step 188, connecting header 140 with circuit board 110 may include soldering terminals $160_N$ of header 140 to circuit board 110 (e.g., at and/or from an underside 114 of circuit board 110). With embodiments, terminals $160_N$ ma be connected to circuit board 110 via reflow soldering. For example, and without limitation, solder paste may be applied to a top side of circuit board 110 and terminals $160_N$ may push at least some of solder paste as terminals $160_N$ are inserted into apertures 112. Circuit board 110 may then be soldered (e.g., in a reflow oven). During soldering, the solder paste may flow through apertures 112 to underside 114 of circuit board 110.

In embodiments, matrix connectors $150_N$ may be connected with circuit board 110 before matrix connector $150_N$ are connected with header 140. In such configurations, header 140 may be connected to matrix connectors $150_N$ (which have already been connected to circuit board 11) in or more of a variety of ways, such as via a snap fit, fusing, and press-fitting, among others.

In embodiments, solder 172 used in soldering terminals $160_N$ with circuit board 110 may include a lower liquidus point than solder preforms $170_N$, which may allow for terminals $160_N$ to be soldered/fixed to circuit board 110 without melting the solder 172 connecting matrix connectors $150_N$ with connection matrices $120_N$ (e.g., header 140 may remain substantially fixed relative to circuit board 110 during soldering of terminals $160_N$ to circuit board 110). If the liquidus point of solder preforms $170_N$ is similar to or lower than the liquidus point of the solder 172 used with terminals $160_N$, the heat used to solder terminals $160_N$ may be sufficient to melt solder preforms $170_N$ and/or allow matrix connectors $150_N$ to move relative to connection matrices $120_N$ during soldering (e.g., terminals $160_N$ may tend to move, with header 140, toward the center of apertures 112 during soldering if header 140 is not otherwise fixed to circuit board 110).

In embodiments, connecting header 140 to circuit board 110 may include soldering (e.g., oven reflow soldering) header 140 to circuit board 110 via solder preforms $170_N$. Then, terminals $160_N$ may be soldered to circuit board 110 (e.g., via wave soldering at the bottom of circuit board 110). Wave soldering (e.g., selective wave soldering) may apply heat relatively locally to terminals $160_N$ and/or there may be a relatively poor thermal path between terminals $160_N$ and matrix connectors $150_N$, which may allow for the liquidus temperatures of solder preforms $170_N$ and solder 172 to be similar (e.g., wave soldering the bottom of circuit board 110 may not re-melt solder preforms $172_N$, which may permit header 140 to remain in the same position relative to circuit board 110).

In embodiments, once a circuit board assembly 100 has been designed and/or assembled, it may, in step 190, be validated (e.g., certified, measured, tested, etc.). In step 192, it may be determined whether the circuit board assembly 100 meets certain requirements (e.g., desired measurements/dimensions). If the circuit board assembly 100 does meet the requirements, subsequent circuit board assemblies may be assembled in generally the same manner (e.g., step 194). If the circuit board assembly 100 does not meet such requirements, positioning of matrix connectors $150_N$ may, in step 196, be adjusted for subsequent circuit board assemblies. In some circumstances, certain environmental factors may change (e.g., dimensions of a connector and/or housing that may be used with terminals $160_N$ and/or header 140) and it may be desirable to shift the position of header 140 relative to circuit board 110 in subsequent circuit board assemblies. For example, and without limitation, a second circuit board assembly (see, e.g., FIGS. 4 and 5B) may be assembled in substantially the same way as described above, but matrix connectors $150_N$ may be connected to different solder pads (e.g., solder pads $130_{1B}$, $130_{2B}$, $130_{3B}$, $130_{4B}$) of connection matrices $120_N$, and terminals $160_N$ may be in different positions in respective apertures 112.

In some circumstances, it may be determined that a certain group/batch of components (e.g., a header 140) include a deviation from an expected measurement. In such circumstances, a method of assembling/adjusting a circuit board assembly (e.g., circuit board assembly 100) may begin, for example, in step 196, with adjusting matrix connectors (e.g., matrix connectors $150_N$) from a previous configuration according to the deviation. The method may then continue with positioning a header (step 184), connecting the header with a circuit board (step 186), and soldering terminals to the circuit board (step 188), which may complete an assembly/adjusting process.

With embodiments, assembly/adjustment of a circuit board assembly 100 may include some or all of described steps (some of which may be combined with one or more other steps), and the steps may or may not be performed in the order described in connection with the provided embodiments. For example, and without limitation, if a desired configuration is determined, assembly/adjustment of a circuit board assembly 100 may include with providing a circuit board 110 (step 180), positioning matrix connectors $150_N$ (step 182), positioning a header 140 (step 184), connecting header 140 with a circuit board 110 (step 186), and soldering terminals $160_N$ to the circuit board 110 (step 188), which may complete an assembly/adjusting process (e.g., the method may not include measuring/validating in step 190, determining if a desired positioning was obtained in step 192, and/or adjusting matrix connectors $150_N$ in step 196).

Figure 8:
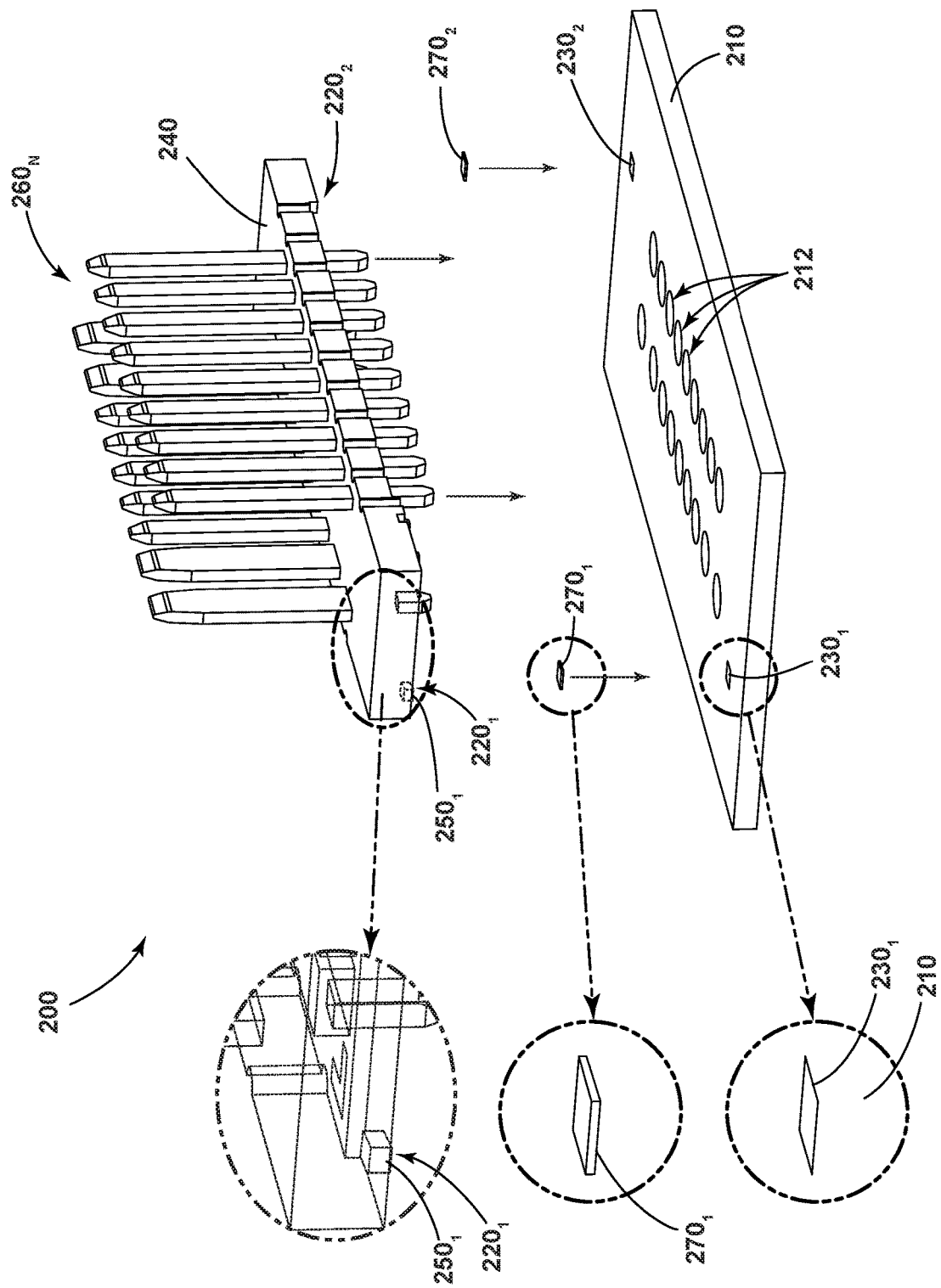
FIG. 8 is a perspective view, including various enlarged views, of an embodiment of a circuit board assembly according to teachings of the present disclosure.
Figure 8A:
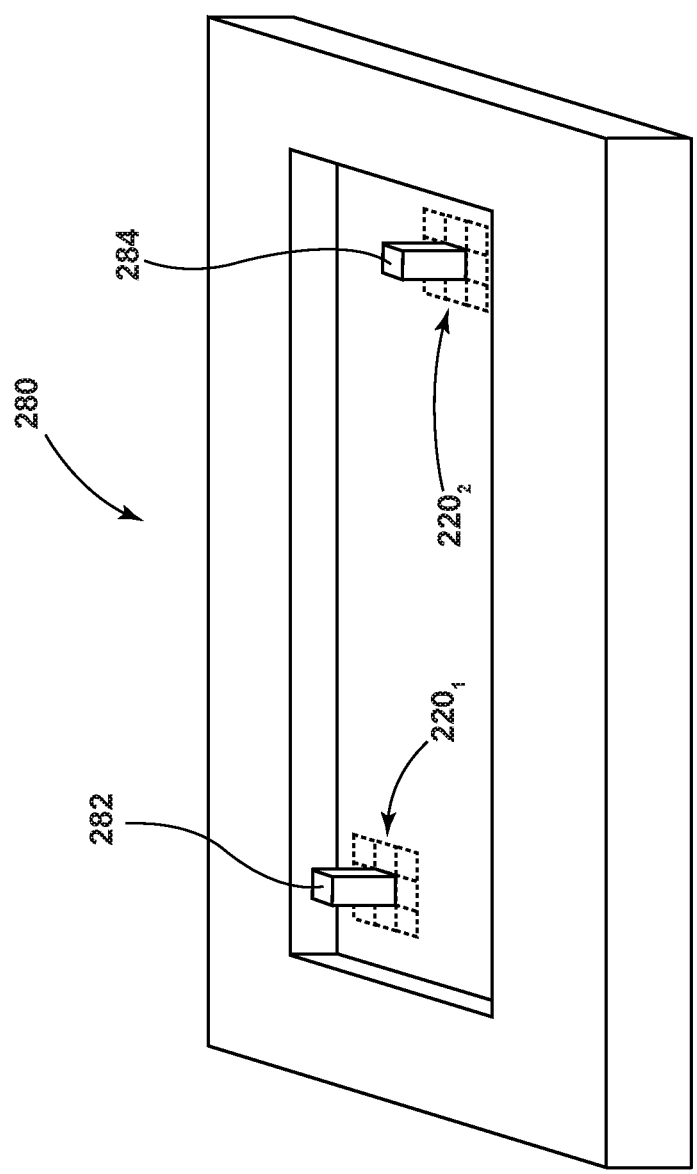
FIG. 8A is a perspective view of an embodiment of a mold for forming embodiments of headers according to teachings of the present disclosure.
Figure 9:
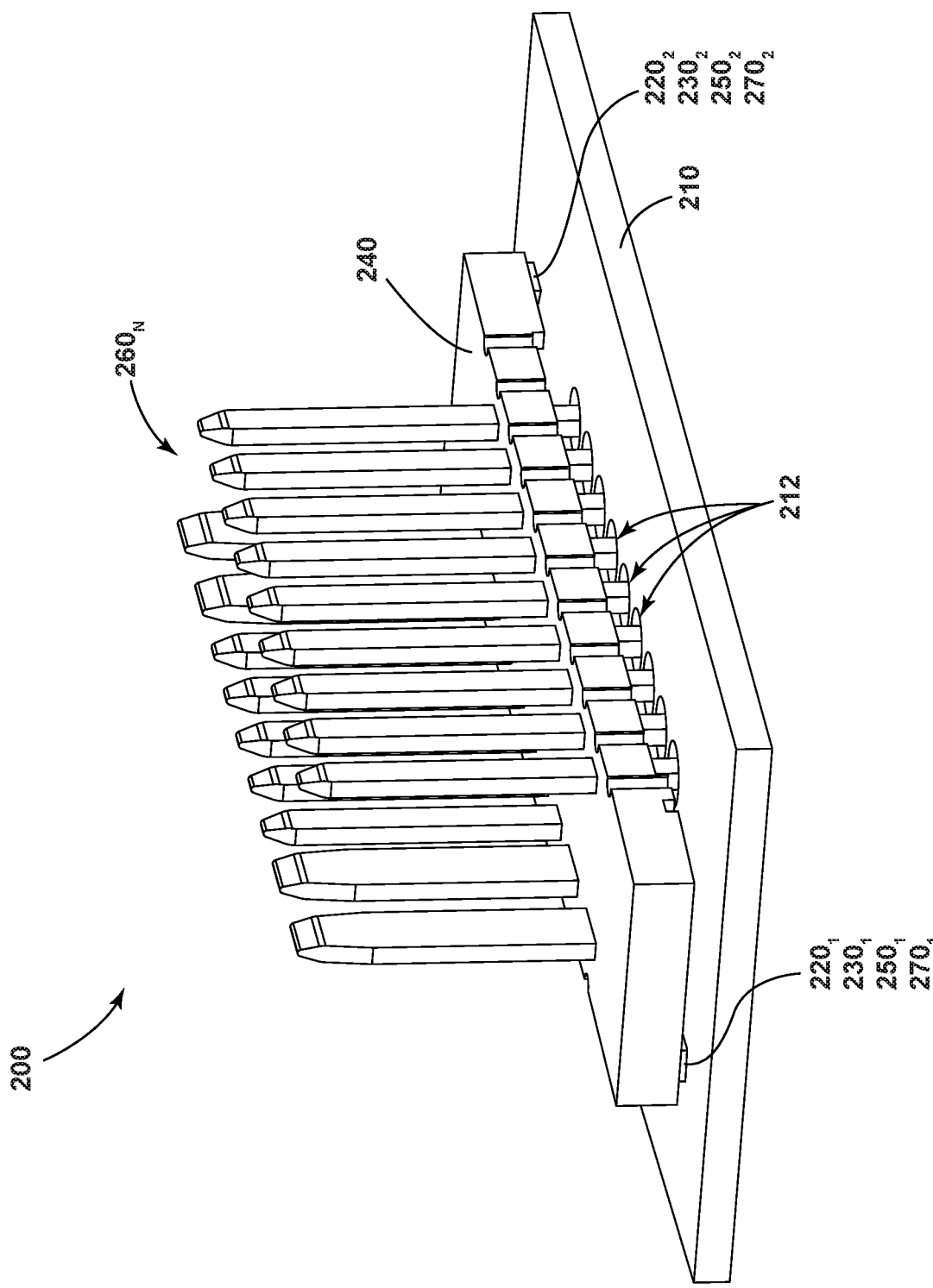
FIG. 9 is a perspective view of an embodiment of a circuit board assembly according to teachings of the present disclosure.
Figure 11:
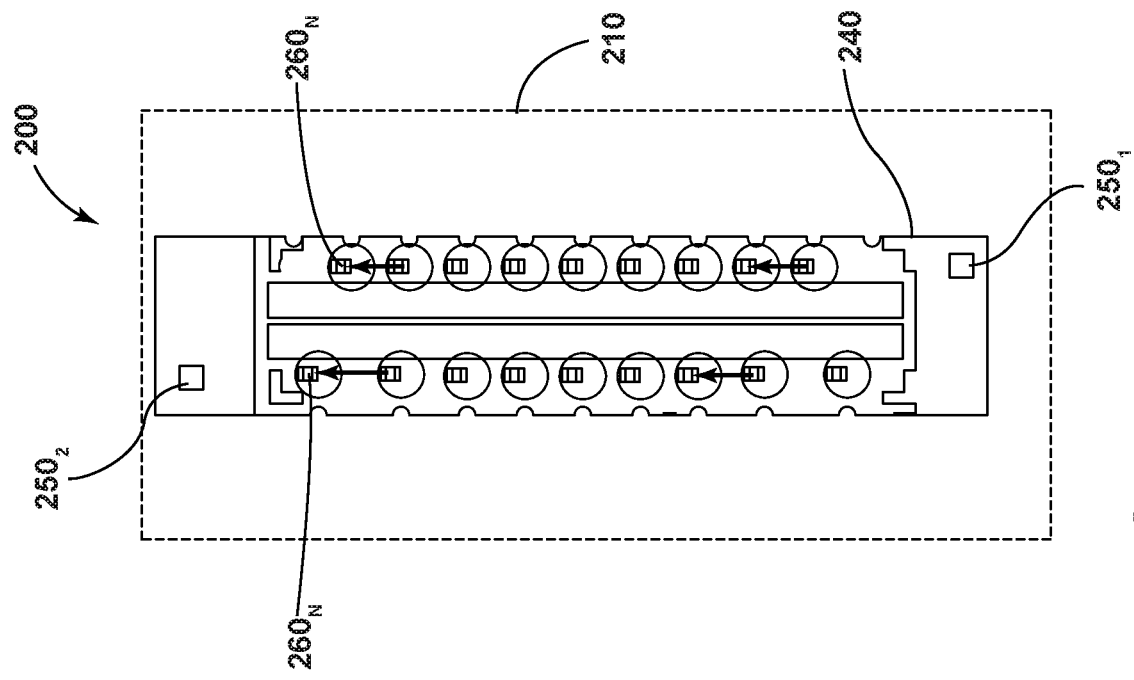
FIGS. 10 and 11 are bottom views of embodiments of circuit board assemblies according to teachings of the present disclosure in which circuit boards are shown as transparent for illustrative purposes.
Figure 10:
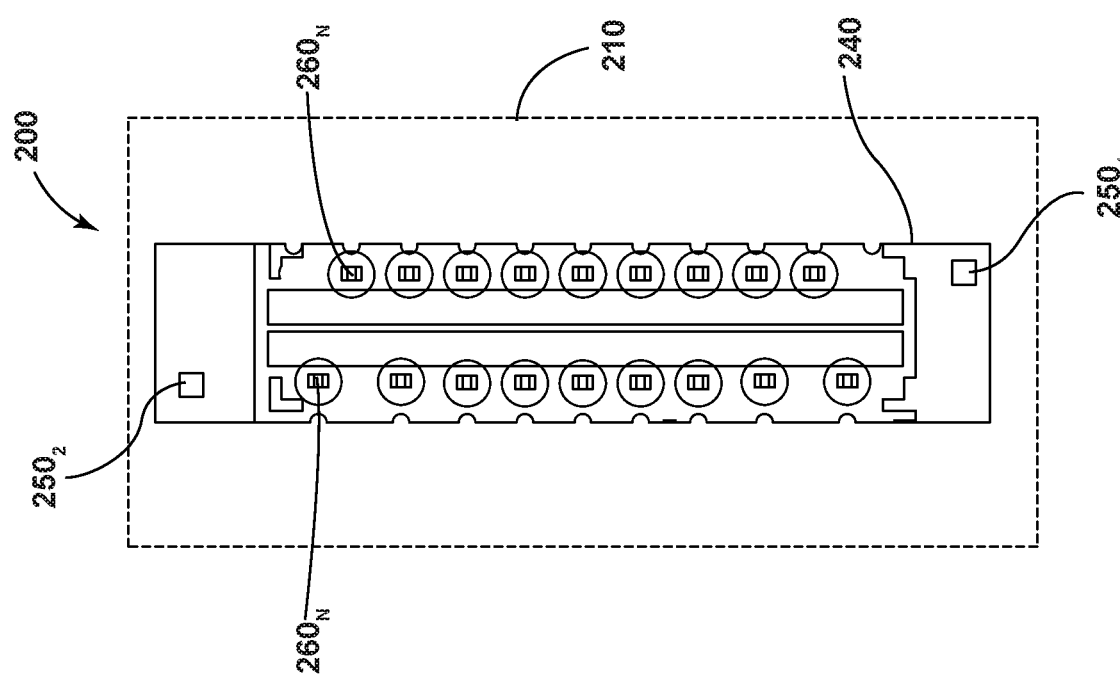
Figure 12:
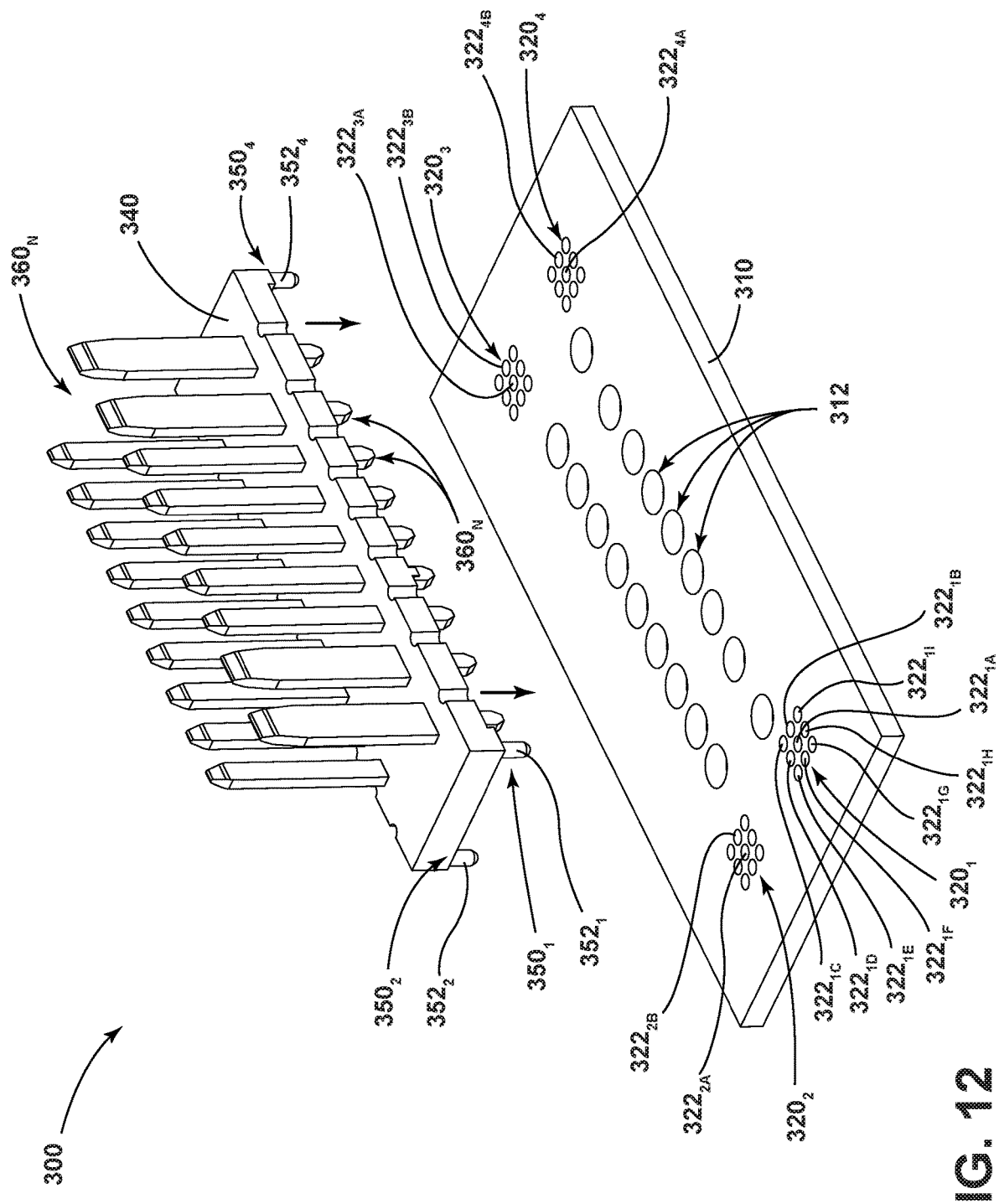
FIG. 12 is a perspective view of an embodiment of a circuit board assembly according to teachings of the present disclosure.
Figure 13:
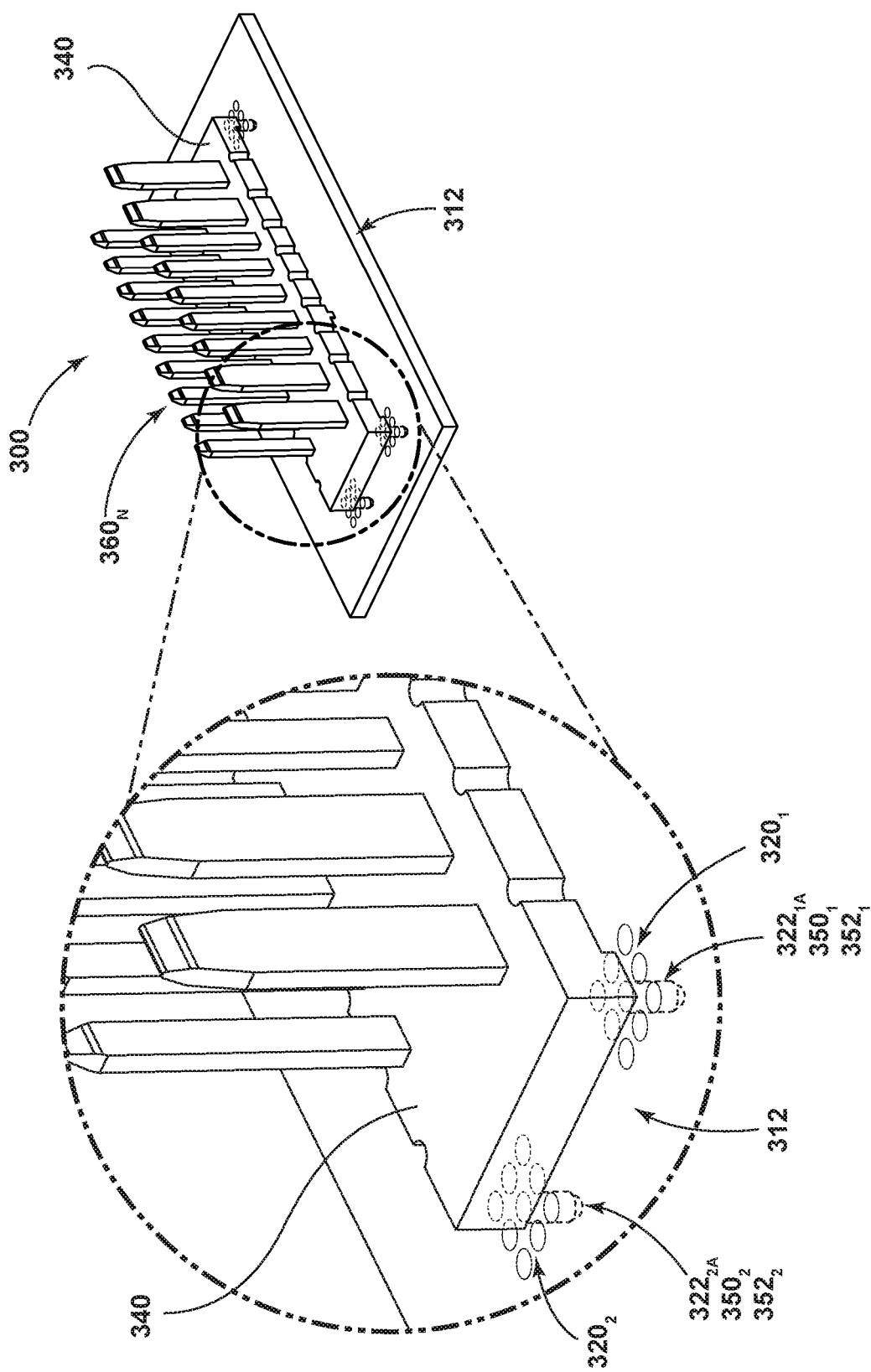
FIG. 13 is a perspective view, including an enlarged view, of an embodiment of a circuit board assembly according to teachings of the present disclosure.
Figures 16, 17:
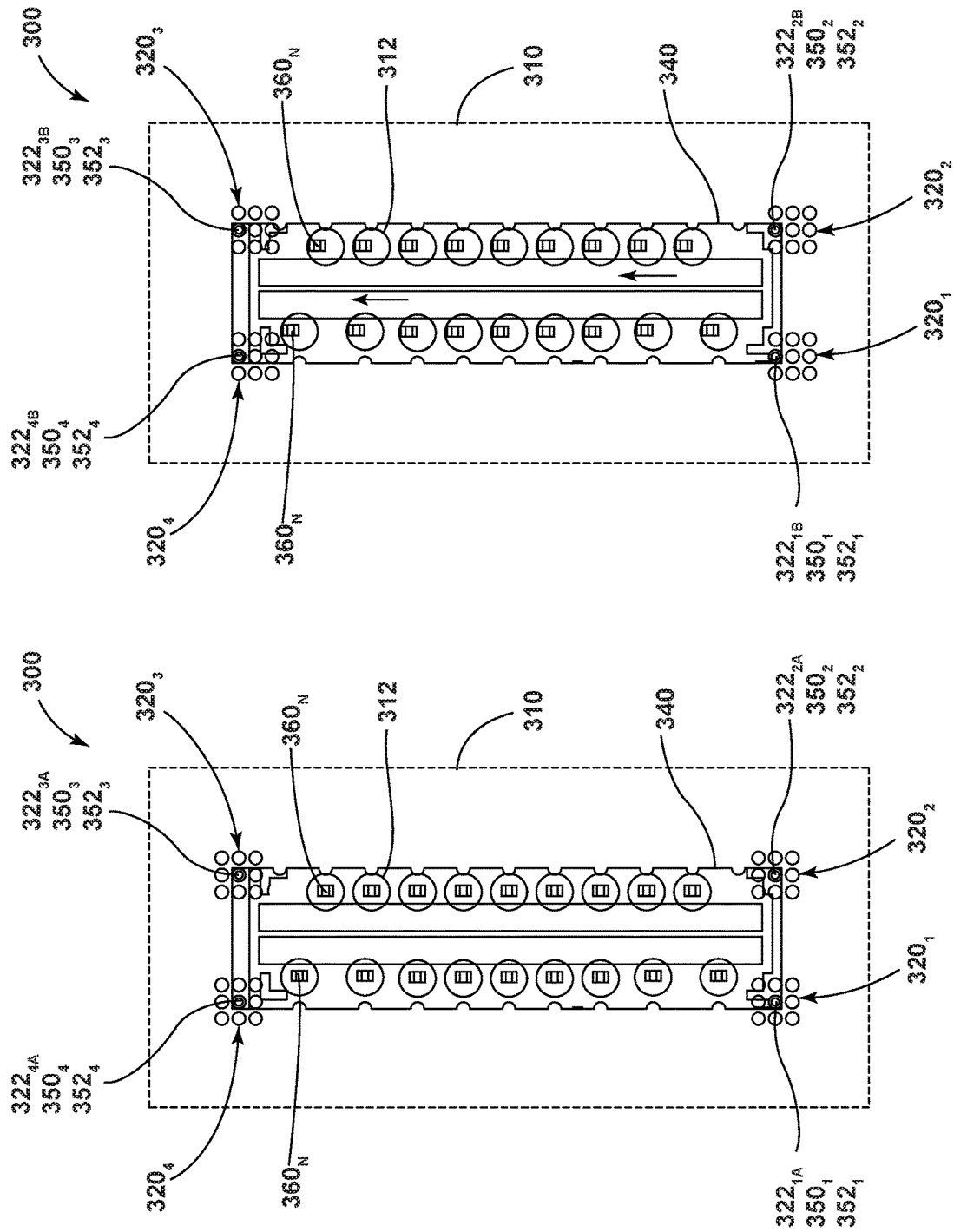
FIGS. 16 and 17 are bottom views of embodiments of circuit board assemblies according to teachings of the present disclosure in which circuit boards are shown as transparent for illustrative purposes.

In embodiments, such as generally illustrated in FIGS. 8, 9, 10 and 11, an adjustable circuit board assembly 200 may be configured in a similar manner as circuit board assembly 100, and may include a circuit board 210 with a plurality of apertures 212 and/or may include a header 240 that may include terminals $260_N$. However, with circuit board assembly 200, header 240 may include one or more connection matrices $220_N$ (e.g., matrices $220_1$, $220_2$) and one or more matrix connectors $250_N$ (e.g., connectors $250_1$, $250_2$), and/or circuit board 210 may include a solder pad $230_N$ for each matrix connector $250_N$ of header 240 (e.g., solder pads $230_1$, $230_2$, $230_3$, $230_4$). Connection matrices $220_N$ of header 240 may include a plurality of possible connection positions for matrix connectors $250_N$ relative to header 240. Matrix connectors $250_N$ of circuit board assembly 200 may be connected with header 240 in one or more of a variety of ways. For example, and without limitation, a mold 280 for forming header 240 may provide header 240 with one or more connection matrices $220_N$ (see, e.g., FIG. 8A). The mold 280 may be used with inserts 282, 284 that may be selectively positioned relative to the mold 280 to form a recess for each matrix connector $250_N$ and each insert 282, 284 may be configured to form a recess in a least one particular position of the connection matrix $220_N$. Such a mold 280 may be used for a plurality of configurations of header 240 (e.g., positions of matrix connectors $250_N$ relative to header 240) without modifying mold 280 other than the positioning of the inserts 282, 284.

In embodiments, a method of assembling circuit board assembly 200 be fairly similar to the method described in connection with FIG. 7, and/or may include providing circuit board 210, which may include one or more solder pads $230_N$, and/or providing header 240. Header 240 may be formed via an adjustable mold 280 configured to adjust connection positions of matrix connectors $250_N$ within a connection matrix $220_N$. Matrix connectors $250_N$ may be connected to header 240 in first positions. Solder preforms $270_N$ (e.g., solder preforms $270_1$, $270_2$) may be connected to (e.g., disposed on and/or near) solder pads $230_N$ and/or matrix connectors $250_N$. Header 240 may be aligned with circuit board 210 such that matrix connectors $250_N$ are aligned with solder pads $230_N$ and/or solder preforms $270_N$, and terminals $260_N$ may be inserted into corresponding apertures 212 of circuit board 210. Matrix connectors $250_N$ may then be connected with solder pads $230_N$ via solder preforms $270_N$, and solder preforms $270_N$ may be permitted to cool/solidify. Terminals $260_N$ of header 240 may then be soldered to circuit board 210 (e.g., at a lower temperature than the soldering of solder preforms $270_N$). In a second configuration (see, e.g., FIG. 11), matrix connectors $250_N$ may be connected to header 240 in different positions within connection matrices $220_N$, which may correspond to header 240 being connected to circuit board 210 in a different position and/or terminals $260_N$ being disposed in different positions within apertures 212. For example, and without limitation, connecting matrix connectors $250_N$ with header 240 in a second configuration may include forming header 240 to include recesses (or other connection features) for connecting with matrix connectors $250_N$ in a different position relative to the first configuration.

In embodiments, a circuit board assembly (e.g., circuit board assemblies 100, 200) may include a circuit board 110 with a connection matrix $120_N$ and a header 240 with a connection matrix $220_N$ (e.g., matrix connectors $150_N$, $250_N$ may be connected to a circuit board 110 in a plurality of positions and connected to header 240 in a plurality of positions).

In embodiments, such as generally illustrated in FIGS. 12, 13, 14, 15, 16, and 17, an adjustable circuit board assembly 300 may be configured in a similar manner as circuit board assembly 100, and may include a circuit board 310 with a plurality of apertures 312 and/or may include a header 340 that may include terminals $360_N$. However, with circuit board assembly 300, one or more connection matrices $320_N$ of circuit board 310 may include a plurality of connector apertures $322_N$ configured to receive at least a portion of a matrix connector $350_N$. Matrix connectors $350_N$ may include one or more of a variety of shapes, sizes, materials, and/or configurations. For example, and without limitation, matrix connectors $350_N$ may include metallic and/or plastic materials. Matrix connectors $350_N$ may be connected/incorporated with header 340 and/or may include a protrusion $352_N$ (e.g., protrusions $352_1$, $352_2$, $352_3$, $352_4$) that may be configured for insertion into connector apertures $322_N$ of connection matrices $320_N$. For example, and without limitation, header 340 may include four matrix connectors $350_1$, $350_2$, $350_3$, $350_4$ that may be disposed at or about respective corners of header 340. Circuit board 310 may include four connection matrices $320_1$, $320_2$, $320_3$, $320_4$ configured to be aligned with matrix connectors $350_1$, $350_2$, $350_3$, $350_4$. With embodiments, each connection matrix $320_N$ may include, for example, nine apertures $322_{1A}$, $322_{1B}$, $322_{1C}$, $322_{1D}$, $322_{1E}$, $322_{1F}$, $322_{1G}$, $322_{1H}$, $322_{1I}$, which may correspond to nine potential configurations/positions of header 340 relative to circuit board 310. Connector apertures $322_N$ and/or matrix connectors $350_N$ may be configured for a press/interference fit (e.g., the diameters of each may be similar, and/or the diameter of matrix connectors $350_N$ may be at least as large or larger than the diameters of apertures $322_N$), may be configured for a clearance fit, and/or a combination of press fits and clearance fits.

In embodiments, a method of assembling circuit board assembly 300 may be similar to the method described in connection with FIG. 7, and/or may include providing circuit board 310, which may include a plurality of connection matrices $320_N$ and/or a plurality of terminal apertures 312. The method may include providing a header 340, which may include/be connected with matrix connectors $350_N$. Matrix connectors $350_N$ may be configured for connection with the plurality of connection matrices $320_N$. Header 340 may include a plurality of electrical terminals $360_N$. Connection matrices $320_N$ may include a plurality of connector apertures $322_N$ that may be configured to at least partially receive matrix connectors $350_N$ (e.g., receive protrusions $352_N$). Header 340 may be aligned with circuit board 310 such that protrusions $352_N$ of matrix connectors $350_N$ are aligned with a first set of connector apertures (e.g., middle connector apertures $322_{1A}$, $322_{2A}$, $322_{3A}$, $322_{4A}$, such as generally illustrated in FIGS. 12-14 and 16). Header 340 may be connected with circuit board 310, which may include inserting matrix connector protrusions $352_N$ into connector apertures $322_N$ and/or inserting terminals $360_N$ into terminal apertures 312. Terminals $360_N$ may then be soldered to circuit board 310, and matrix connectors $350_N$ may restrict and/or prevent movement (e.g., centering) of terminals $360_N$ in terminal apertures 312 (e.g., at least during soldering). If, after assembly of a first circuit board assembly 300, a different positioning of header 340 is desired, subsequent circuit board assemblies 300 may be assembled via inserting matrix connectors $350_N$ into a different set of connector apertures (e.g., $322_{1B}$, $322_{2B}$, $322_{3B}$, $322_{4B}$) of connections matrices $320_N$ of circuit board 310 (see, e.g., FIGS. 15 and 17).

In embodiments, such as generally illustrated in FIGS. 18, 19, 20, and 21 an adjustable circuit board assembly 400 may be configured in a similar manner as circuit board assembly 200, and/or circuit board assembly 400 may generally resemble a reverse configuration of circuit board assembly 300. Circuit board assembly 400 may include a circuit board 410 with a plurality of terminal apertures 412, may include a header 440 with terminals $460_N$ and one or more connection matrices $420_N$ (e.g., matrices $420_1$, $420_2$), and/or may include matrix connectors $450_N$ (e.g., connectors $450_1$, $450_2$) that may be connected with header 440 in a plurality of positions of connection matrices $420_N$. Compared with circuit board assembly 200, circuit board assembly 400 may include a connector aperture $422_N$ (e.g., apertures $422_1$, $422_2$) for each matrix connector $450_N$ (e.g., instead of solder pads $230_N$) and/or matrix connectors $450_N$ may include protrusions $452_N$ (e.g., protrusions $452_1$, $452_2$) configured for insertion into the connector apertures $422_N$ (e.g., as opposed to matrix connectors being configured for soldering like matrix connectors $250_N$, although matrix connectors $450_N$ may include protrusions $452_N$ and be configured for soldering). Matrix connectors $450_N$ may include the same or similar configurations as matrix connectors $350_N$ of circuit board assembly 300.

Figure 18:
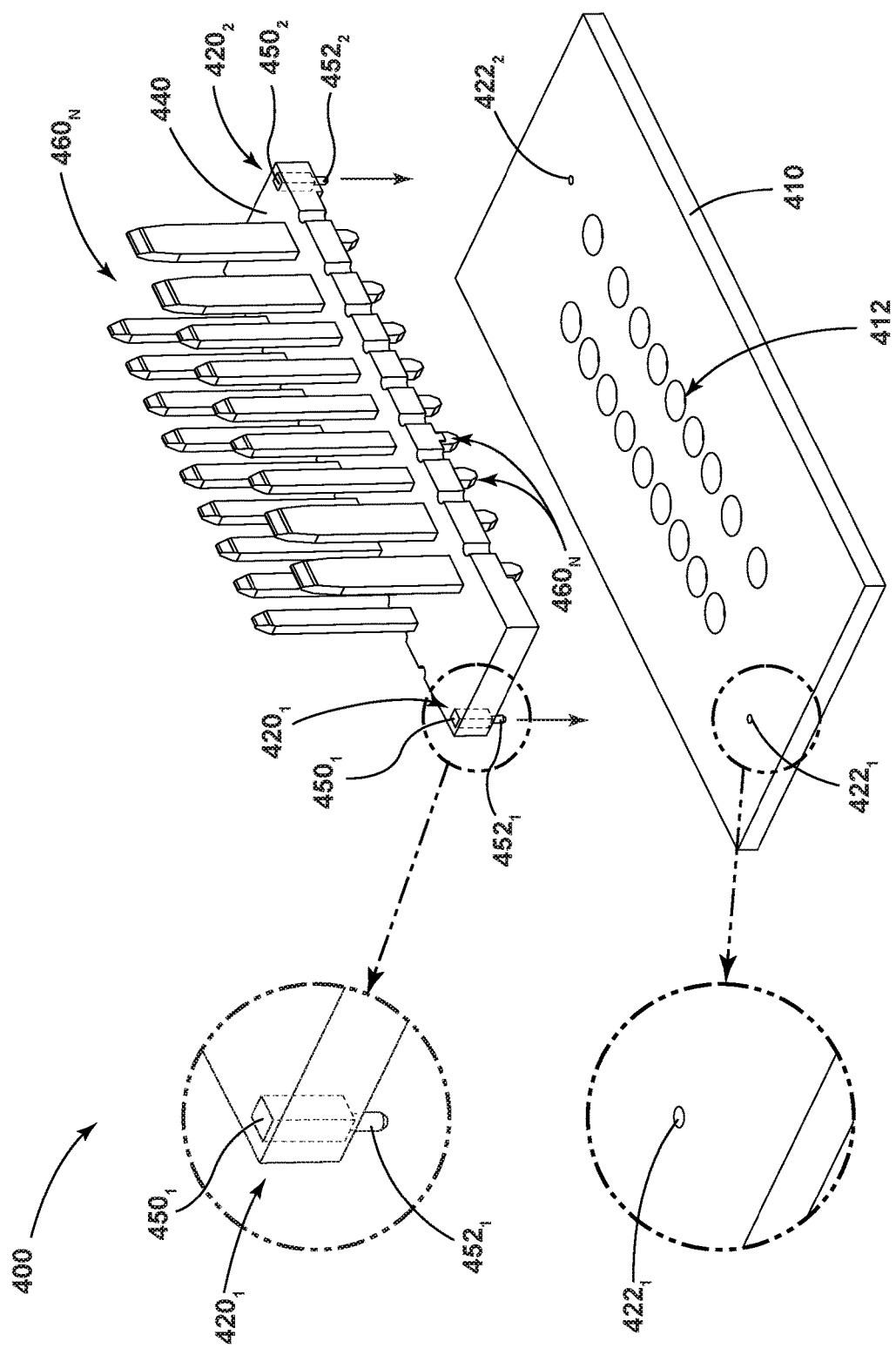
FIG. 18 is a perspective view, including various enlarged views, of an embodiment of a circuit board assembly according to teachings of the present disclosure.
Figure 19:
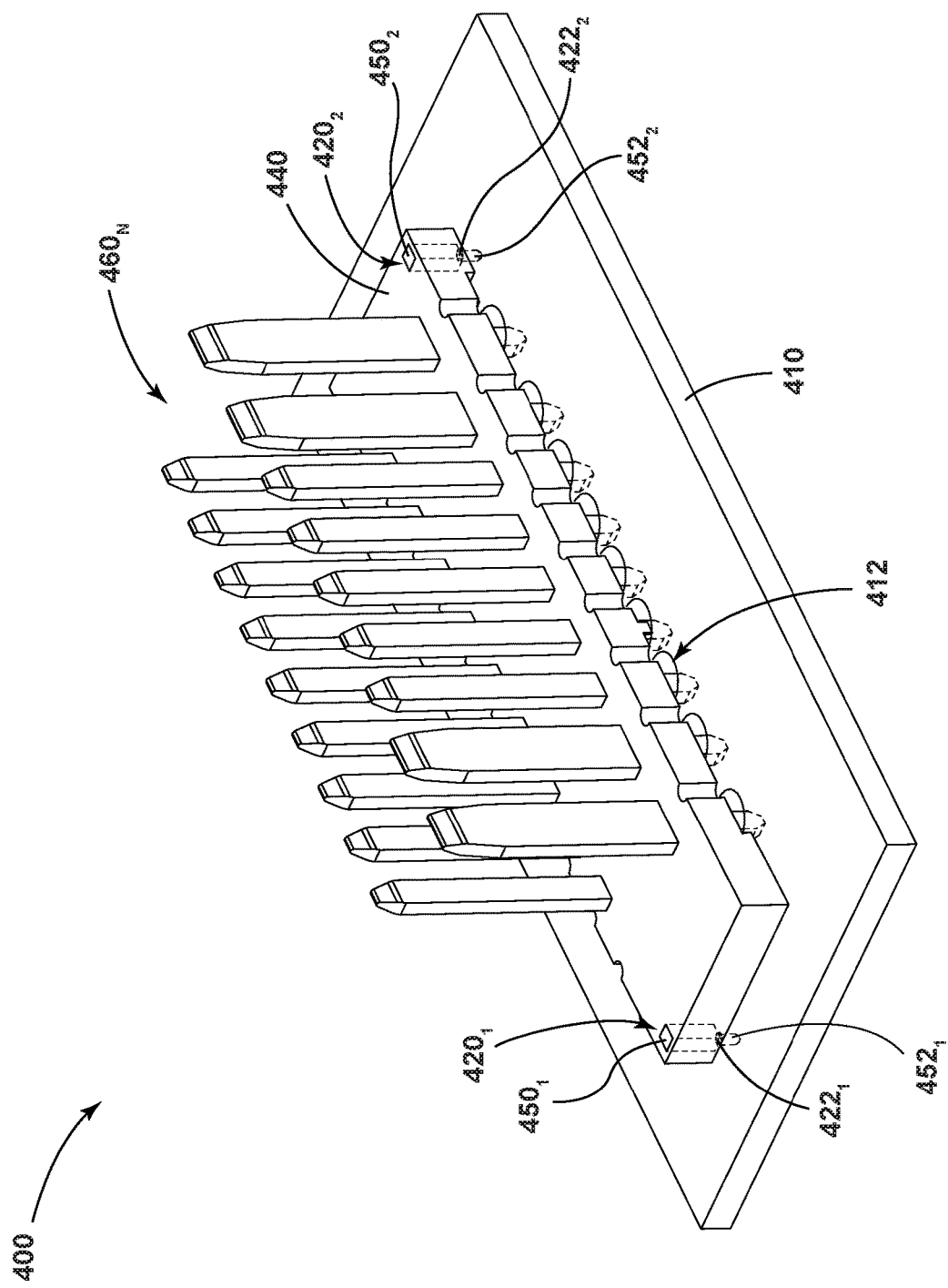
FIG. 19 is a perspective view of an embodiment of a circuit board assembly according to teachings of the present disclosure.
Figure 20:
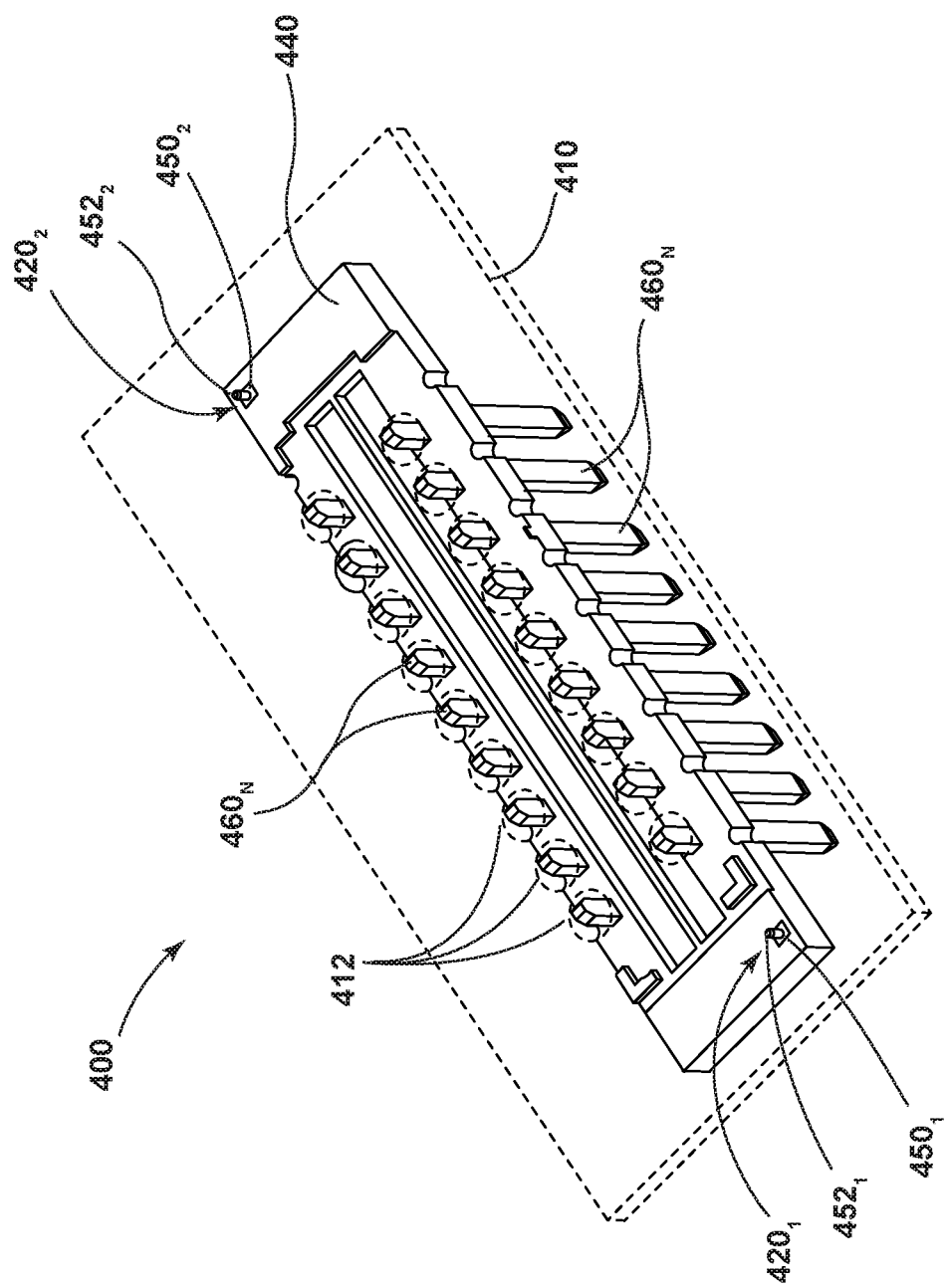
FIGS. 20 and 21 are perspective views of bottoms of embodiments of circuit board assemblies according to teachings of the present disclosure in which circuit boards are shown as transparent for illustrative purposes.
Figure 21:
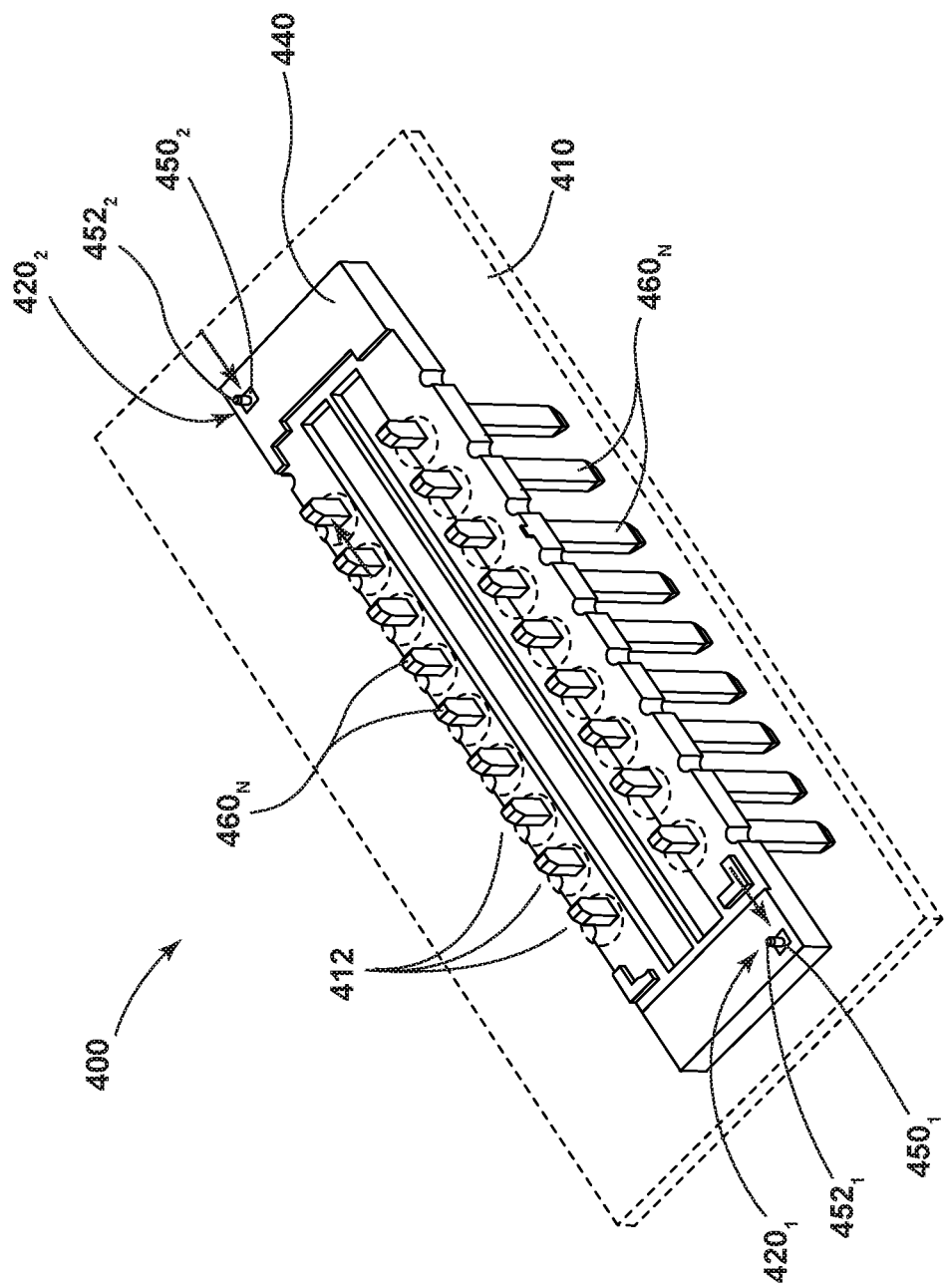
Figure 25:
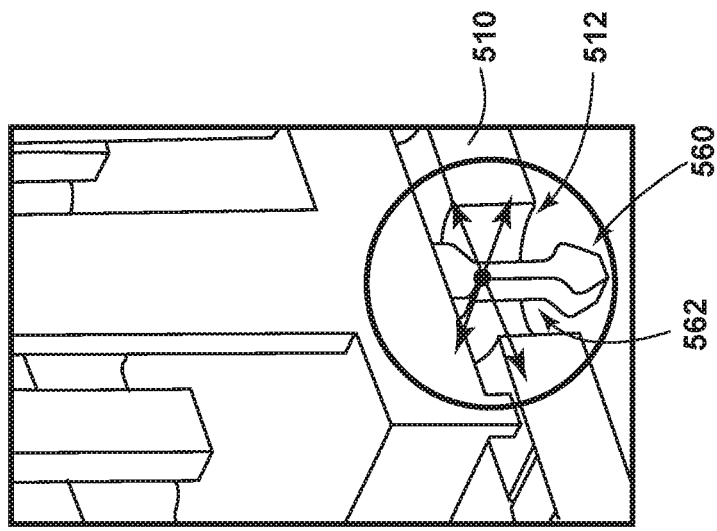
FIG. 25 is a cross-sectional perspective view of an embodiment of a circuit board assembly according to teachings of the present disclosure.
Figure 24:
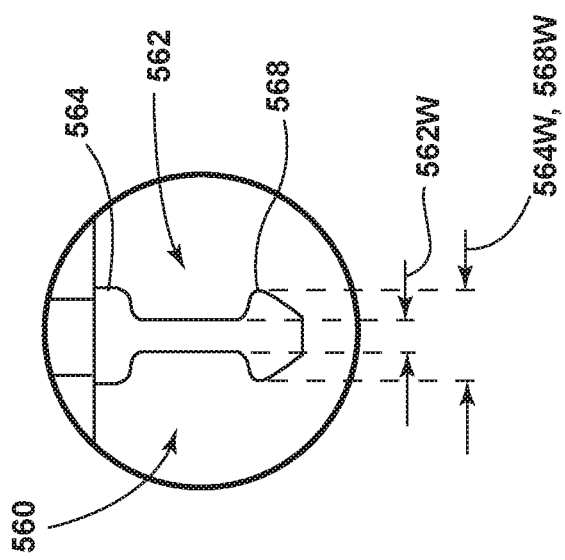

In embodiments, a method of assembling circuit board assembly 400 may be similar to the method described in connection with FIG. 7, and/or may include providing a circuit board 410, which may include one or more connector apertures and/or the method may include providing header 440. Similar to header 240, header 440 may be formed, for example, via an adjustable mold (e.g., mold 280) configured to adjust connection positions of matrix connectors $450_N$ within a connection matrix $420_N$ of possible positions. In a first configuration, matrix connectors $450_N$ may be connected to header 440 in first positions (e.g., middle positions, such as generally illustrated in FIGS. 18-20). Header 440 may then be aligned with circuit board 410 such that matrix connector protrusions $452_N$ are aligned with connector apertures $422_N$. Matrix connector protrusions $452_N$ may then be inserted into connector apertures $422_N$, terminals $460_N$ may be inserted into terminal apertures 412, and/or terminals $460_N$ may then be soldered to circuit board 410 (e.g., while matrix connectors $450_N$ restrict lateral movement of terminals $460_N$). In a second configuration (see, e.g., FIG. 21), matrix connectors $450_N$ may be connected to header 440 in different positions within connection matrices $420_N$ (e.g., forward positions), header 440 may be connected to circuit board 410 in a different position, which may correspond to terminals $460_N$ being disposed in different positions within terminal apertures 412.

In embodiments, a circuit board assembly (e.g., circuit board assemblies 300, 400) may include a circuit board 310 with a connection matrix $320_N$ and a header 440 with a connection matrix $420_N$ (e.g., matrix connectors $350_N$, $450_N$ may be connected to a circuit board 310 in a plurality of positions and connected to a header 440 in a plurality of positions).

In embodiments, such as generally illustrated in FIGS. 23, 24, 25, and 27, an electrical terminal 560 may include a thin section 562 that may include a small width (or diameter) 562W. Electrical terminal 560 may include an upper section 564 that may be disposed above thin section 562 and may include a width 564W that may be wider than width 562W of thin section. Width 562W of thin section 562 may be thinner than a width 568W of a lower section 568 of terminal 560 below thin section 562 and/or relative to terminals 660 without thin sections 562, such as generally illustrated in FIGS. 22 and 26). For example, and without limitation, a thin section 562 may be about 25% thinner, about 50% thinner, about 75% thinner, or even thinner than upper sections 564, 664 (with widths 564W, 664W) and/or lower sections 568, 668 (with widths 568W, 668W) of terminals 560, 660. The thickness of thin section 562, upper section 564, and/or lower section 568 may be about the same (e.g., sections 562, 564, 568 may include different widths, but may include the same or about the same thickness).

With embodiments, thin section 562 may be configured to align with a thickness 510T of a circuit board 510 upon insertion of a terminal 560 into a terminal aperture 512 of circuit board 510. Thin section 562 may be configured to allow terminal 560 to move a greater amount within a circuit board aperture 512 than if thin section 562 included the same width as upper section 564 and/or lower section 568. For example, and without limitation, a terminal 560 without thin section 562 may be configured to move a distance X in each direction within a given circuit board aperture 512 (see, e.g., FIG. 26). In contrast, a terminal 560 with thin section 562 may be configured to move a distance X+n, where n corresponds to half of a difference in width between terminal 560 and terminal 660 without a thin section 562 (e.g., half of width 668W less width 562W), in at least two directions within the same aperture or an aperture of about the same size (see, e.g., FIGS. 25 and 27). Additionally or alternatively, thin sections 562 may be configured to allow for use of smaller circuit board apertures 512 (e.g., apertures with smaller diameters). Terminals 560 with thin sections 562 may be used, for example, in connection with one or more of circuit board assemblies 100, 200, 300, 400 and/or may be configured to use with some or all header positions in connection matrices $120_N$, $220_N$, $320_N$, $420_N$. With embodiments, a terminal (e.g., terminal 560) may include a generally circular (or other shape) cross section and thin section 562 may include a relatively small diameter (and/or outer dimensions) than terminals without a thin section (e.g., terminals 660).

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

It is intended that all matter contained in the above description or shown in the accompanying drawings shall be interpreted as illustrative only and not limiting. Changes in detail or structure may be made without departing from the present disclosure.

Furthermore, the mixing and matching of features, elements and/or functions between various examples is expressly contemplated herein so that one of ordinary skill in the art would appreciate from this disclosure that features, elements, and/or functions of one example may be incorporated into another example as appropriate, unless described otherwise, above. Moreover, many modifications may be made to adapt a particular situation or material to the teachings of the present disclosure without departing from the scope thereof. Therefore, it is intended that the present teachings not be limited to the particular examples illustrated by the drawings and described in the specification, but that the scope of the present disclosure will include any embodiments falling within the foregoing description and the appended claims.

What is claimed is:

1. An adjustable circuit board assembly, comprising:
    a circuit board;
    a header connected to the circuit board;
    a first matrix connector;
    a second matrix connector;
    a first connection matrix; and
    a second connection matrix;
    wherein the header is configured for connection with the circuit board in a plurality of configurations via the first connection matrix, the first matrix connector, the second connection matrix, and the second matrix connector;
    the header includes a plurality of electrical terminals disposed in respective apertures of the circuit board separate from the first connection matrix and the second connection matrix; and
    the first connection matrix includes a first plurality of discrete connection portions corresponding to the plurality of configurations; and
    the second connection matrix includes a second plurality of discrete connection portions corresponding to the plurality of configurations.

2. The adjustable circuit board assembly of claim 1, wherein the circuit board includes the first connection matrix and the second connection matrix; and
    the first connection matrix and the second connection matrix are substantially aligned with respective corners of the header.

3. The adjustable circuit board assembly of claim 1, wherein the first plurality of discrete connection portions includes a first plurality of solder pads; and the second plurality of discrete connection portions includes a second plurality of solder pads.

4. The adjustable circuit board assembly of claim 3, wherein the first plurality of solder pads includes at least three adjacent solder pads.

5. The adjustable circuit board assembly of claim 1, wherein the respective apertures are sufficiently large to accommodate for different positions of the plurality of electrical terminals in each configuration of the plurality of configurations; and each electrical terminal of the plurality of electrical terminals is disposed in the same respective aperture of the circuit board in each configuration of the plurality of configurations.

6. The adjustable circuit board assembly of claim 1, wherein the plurality of configurations includes at least three configurations; and the header is connected to the circuit board in different positions in each of the at least three configurations.

7. The adjustable circuit board assembly of claim 1, wherein the first matrix connector includes a protrusion disposed in a recess or aperture of the circuit board.

8. The adjustable circuit board assembly of claim 1, wherein the first connection matrix includes a plurality of recesses or apertures configured to receive a protrusion of the first matrix connector.

9. The adjustable circuit board assembly of claim 1, wherein the first plurality of discrete connection portions and the second plurality of discrete connection portions each include a plurality of solder pads having at least two rows and at least two columns of solder pads; and the first matrix connector is configured for connection with each of the first plurality of discrete connection portions to provide the header with at least four different positions relative to the circuit board.

10. The adjustable circuit board assembly of claim 1, wherein the plurality of configurations includes a first connected position relative to the circuit board in which the first matrix connector is connected with a first discrete connection portion of the first plurality of discrete connection portions, the plurality of configurations includes a second connected position relative to the circuit board in which the first matrix connector is connected with a second discrete connection portion of the first plurality of discrete connection portions; and
the first discrete connection portion is different from and substantially adjacent to the second discrete connection portion.

11. The adjustable circuit board assembly of claim 10, wherein in the first connected position, the plurality of electrical terminals of the header are disposed in a first terminal position in the respective apertures of the circuit board; and wherein in the second connected position, the plurality of electrical terminals are disposed in a different second terminal position in the same respective apertures of the circuit board.

12. The adjustable circuit board assembly of claim 1, wherein at least one electrical terminal of the plurality of electrical terminals includes a thin portion disposed in an aperture of the respective apertures of the circuit board;
the thin portion is disposed between an upper portion and a lower portion; and
the upper portion and the lower portion are wider than the thin portion.

13. The adjustable circuit board assembly of claim 12, wherein the thin portion is at least 25% thinner than the upper portion.

14. An adjustable circuit board assembly, comprising:
a circuit board;
a header connected to the circuit board; and
a matrix connector;
wherein the header is configured for connection with the circuit board in a plurality of configurations via a connection matrix and the matrix connector;
the header is connected to the circuit board via a second connection matrix and a second matrix connector, via a third connection matrix and a third matrix connector, and via a fourth connection matrix and a fourth matrix connector; and
each of the connection matrix, the second connection matrix, the third connection matrix, and the fourth connection matrix includes a plurality of discrete connection portions corresponding to the plurality of configurations.

15. The adjustable circuit board assembly of claim 14, wherein the header includes a plurality of electrical terminals soldered in respective apertures of the circuit board separate from the connection matrix, the second connection matrix, the third connection matrix, and the fourth connection matrix.

16. A method of manufacturing a circuit board assembly, the method comprising:
providing a circuit board;
providing a terminal header including a plurality of terminals;
providing a connection matrix to at least one of the circuit board and the terminal header;
providing a matrix connector;
connecting the terminal header with the circuit board via the matrix connector and the connection matrix in a connected position of a plurality of connected positions; and
soldering the plurality of terminals in respective apertures of the circuit board separate from the connection matrix;
wherein the connection matrix and at least one other connection matrix are provided to the circuit board;
the header is configured for connection with the circuit board in the plurality of connected positions via the connection matrix and the matrix connector; and
the plurality of terminals are disposed in the same respective apertures in each of the plurality of connected positions.

17. The method of claim 16, wherein connecting the terminal header with the circuit board includes soldering the matrix connector to the connection matrix at a first temperature;
soldering the plurality of terminals to the circuit board includes soldering the plurality of terminals to the circuit board at a second temperature; and
the second temperature is lower than the first temperature.

18. The method of claim 16, including:
providing a second circuit board, the circuit board and the second circuit board being substantially identical;
providing a second terminal header including a second plurality of terminals;
providing a second connection matrix to at least one of the second circuit board and the second terminal header;
providing a second matrix connector;
connecting the second terminal header with the second circuit board via the second matrix connector in a second header connected position of a plurality of second header connected positions; and
soldering the second plurality of terminals in respective apertures of the second circuit board, separate from the second connection matrix, to form a second circuit board assembly,
wherein the second header connected position of the second terminal header relative to the second circuit board is different than the connected position of the terminal header relative to the circuit board.

* * * * *